(12) United States Patent
Kuba et al.

(10) Patent No.: US 11,476,079 B1
(45) Date of Patent: Oct. 18, 2022

(54) METHOD AND SYSTEM FOR IMAGING A MULTI-PILLAR SAMPLE

(71) Applicant: FEI Company, Hillsboro, OR (US)

(72) Inventors: Jakub Kuba, Brno (CZ); Tomas Vystavel, Brno (CZ); Magda Zaoralova, Brno (CZ)

(73) Assignee: FEI Company, Hillsboro, OR (US)

( * ) Notice: Subject to any disclaimer, the term of this patent is extended or adjusted under 35 U.S.C. 154(b) by 23 days.

(21) Appl. No.: 17/219,425

(22) Filed: Mar. 31, 2021

(51) Int. Cl.
  *H01J 37/20* (2006.01)
  *H01J 37/26* (2006.01)
  *H01J 37/22* (2006.01)

(52) U.S. Cl.
  CPC ............ *H01J 37/20* (2013.01); *H01J 37/222* (2013.01); *H01J 37/26* (2013.01); *H01J 2237/201* (2013.01); *H01J 2237/20214* (2013.01); *H01J 2237/226* (2013.01)

(58) Field of Classification Search
  CPC ...... H01J 37/20; H01J 37/26; H01J 2337/201; H01J 2237/20214; H01J 2237/226
  See application file for complete search history.

(56) References Cited

U.S. PATENT DOCUMENTS

| 9,837,246 B1 | 12/2017 | Geurts et al. |
| 2012/0006711 A1 | 1/2012 | Goodman et al. |
| 2017/0025246 A1* | 1/2017 | Bouchet-Marquis ........................ H01J 37/222 |

FOREIGN PATENT DOCUMENTS

| EP | 2916343 | 9/2015 |
| EP | 3318862 | 5/2018 |
| JP | 2005233786 | 9/2005 |

* cited by examiner

*Primary Examiner* — Eliza W Osenbaugh-Stewart
(74) *Attorney, Agent, or Firm* — Klarquist Sparkman, LLP

(57) ABSTRACT

Methods include providing a multi-pillar sample including at least a first pillar and a second pillar parallel with the first pillar, directing a charged particle beam to the first pillar, imaging the first pillar at a plurality of rotational positions by rotating the multi-pillar sample about a first pillar axis of the first pillar, directing the charged particle beam to the second pillar, and imaging the second pillar at a plurality of rotational positions by rotating the multi-pillar sample about a second pillar axis of the second pillar. Related apparatus for performing disclosed methods are disclosed. Multi-pillar samples are also disclosed.

22 Claims, 16 Drawing Sheets

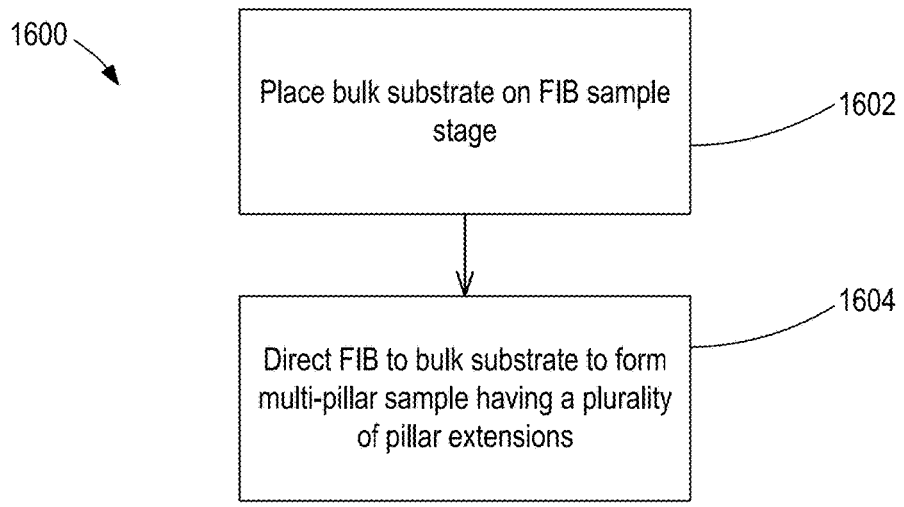
FIG. 16
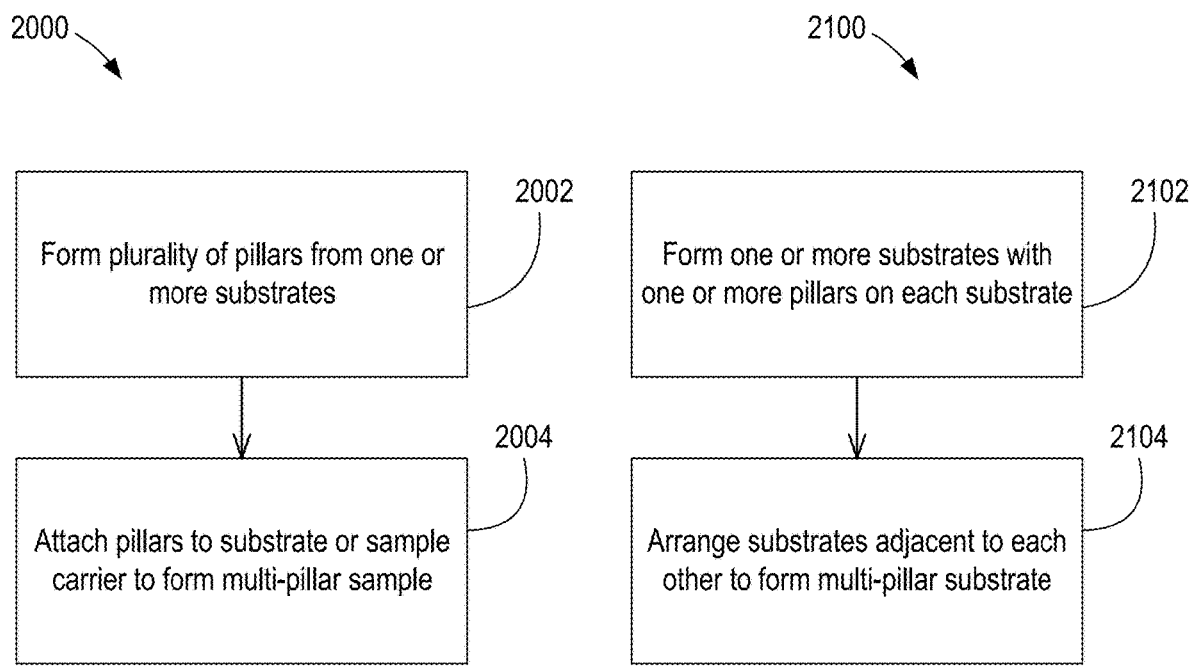
FIG. 20
FIG. 21

METHOD AND SYSTEM FOR IMAGING A MULTI-PILLAR SAMPLE

FIELD

The field is tomography.

BACKGROUND

Examples of lamella tomography can include using a transmission electron microscope (TEM) to acquire a series of images of a sample at various tilt-rotation positions. For example, as shown in FIGS. 1A-1C, a thin lamella sample 100 can extend in a sample plane 102 to form a thin planar layer presenting multiple thin regions for tomographic imaging. The sample 100 can be located in a sample carrier 104 that is held by a movement stage 106 within the field of view of an electron beam 108. The electron beam transmits through the sample 100 and is received by an imaging sensor 110 to form an image. To produce a series of images for tomographic reconstruction, the movement stage 106 tilts the sample 100 through a series of rotation angles. For example, the sample 100 can be imaged at 0 degrees as shown in FIG. 1B in which the sample plane 102 is perpendicular to an axis 112 of the incident electron beam, and through a series of angle increments provided by the movement stage in a predetermined+/−rotational range from a 0 degrees position of the sample plane 102. Images are captured at the various tilt positions, stored, and then used to reconstruct a tomogram, or 3D image of the sample.

In thin samples, this tilt range is often limited to −70/+70 degrees, e.g., as shown in FIG. 1C, due to the sample carrier 104 that supports the sample 100. Such a limit is usually related to the edge of the carrier or other support structure for the sample interfering with the electron beam used to image the sample. Another problem that occurs in thin samples is that an effective thickness of the sample increases as the thin sample is tilted to higher tilt angles, as shown by the arrows in FIGS. 1B-1C. The larger effective thickness attenuates the transmitting electron beam and reduces image quality and therefore reduces the quality of the tomographic reconstruction.

Thus, there remain numerous problems associated with lamella tomography. A tilt range for rotating a lamellar sample is typically limited, e.g., by edge obstruction of the carrier used to hold the lamellar sample and related imaging effects, or by a variation in effective thickness of the lamellar sample as the sample's rotational position varies through the tilt range of the tomographic acquisition, as discussed above. This limited tilt range leads to limited information obtained from the sample and reduced quality tomographic reconstructions. Therefore, a need for improved tomographic techniques.

SUMMARY

According to an aspect of the disclosed technology, methods include providing a multi-pillar sample including at least a first pillar and a second pillar parallel with the first pillar, directing a charged particle beam to the first pillar, imaging the first pillar at a plurality of rotational positions by rotating the multi-pillar sample about a first pillar axis of the first pillar, directing the charged particle beam to the second pillar, and imaging the second pillar at a plurality of rotational positions by rotating the multi-pillar sample about a second pillar axis of the second pillar. Some methods include reconstructing 3D images of the first pillar and the second pillar. In some reconstructions, the 3D images cover a full angular span of the first and the second pillar. In some examples, a range of the plurality of positions is at least 170 degrees. In some examples, a range of the plurality of positions is at least 80 degrees. In some examples, a range of the plurality of positions is at least 180 degrees. Some examples include translating the multi-pillar sample along the first pillar axis and rotatably imaging another section of the first pillar before moving the multi-pillar sample to image the second pillar. In some examples, imaging the first pillar includes rotating the multi-pillar sample to a selected position of either a +90 degree position or a −90 degree position and producing an image at the selected position with reduced obstruction by the second pillar or other pillars of the multi-pillar sample based on an angled linear arrangement of a plurality of pillars of the multi-pillar sample relative to a 0 degree position. In some examples, the multi-pillar sample comprises a substrate defined by a length, a width, and a height, wherein the first pillar and the second pillar extend from the substrate along the height of the substrate and are arranged at different positions on the length of the substrate in a spaced series. Some multi-pillar sample substrates are a sample carrier. Some examples include attaching a plurality of pillars to the substrate to form the multi-pillar sample. In some examples, a distance between the first pillar and the second pillar is greater than 10 times of a diameter of either the first pillar or the second pillar. Some examples include directing a focused ion beam to mill a raw sample substrate to form the multi-pillar sample.

According to another aspect of the disclosed technology, apparatus include an imaging system configured to direct a charged particle beam to a multi-pillar sample including at least a first pillar and a second pillar, a movement stage configured to move and rotate the multi-pillar sample about a plurality of different pillar axes of the multi-pillar sample, and a processor and memory coupled to the sample stage and the imaging system wherein the memory includes code that, when executed by the processor: causes the sample stage to rotate the multi-pillar sample about a first pillar axis of a first pillar, and to rotate the multi-pillar sample about a second pillar axis of the second pillar, and causes the imaging system to direct the imaging beam through the first pillar at a plurality of rotational positions about the first pillar axis, and to direct the imaging beam through the second pillar at a plurality of rotational positions about the second pillar axis. Some examples include an imaging sensor for detecting charged particles transmitted through the first pillar and the second pillar, and the memory includes further code that, when executed by the processor: causes the imaging sensor to detect a plurality of first images of the first pillar at the plurality of rotational positions about the first pillar axis, and detect a plurality of second images of the second pillar at the plurality of rotational positions about the second pillar axis. In some examples, the memory includes further code that, when executed by the processor: causes the processor to reconstruct 3D images of the first pillar and the second pillar based on the plurality of first images and the plurality of second images, respectively. In some examples, the multi-pillar sample comprises a substrate defined by a length, a width, and a height, the substrate extending in a plane defined by the length and width, and the first pillar and the second pillar extending parallel to each other from the substrate along the height of the substrate and arranged at different positions on the length of the substrate in a spaced series. Some examples further include a sample carrier, and the substrate is the sample carrier. In some examples, the first pillar axis and the second pillar axis form a pillar plane not parallel with a plane defined by the length and width of the substrate. In some examples, the memory includes further code that, when executed by the processor: causes the sample stage to move the multi-pillar sample so that the charged particle beam is directed to the first pillar or the second pillar. In representative examples, the first pillar and the second pillar have a tip thickness of less than 400 nm, a base thickness of more than 400 nm, and a length of greater than 1 μm. In further examples, the first pillar and the second pillar have a tip thickness of less than 600 nm, a base thickness of more than 400 nm, and a length of greater than 1 μm.

The foregoing and other objects, features, and advantages of the disclosed technology will become more apparent from the following detailed description, which proceeds with reference to the accompanying figures.

BRIEF DESCRIPTION OF THE DRAWINGS

FIG. 16 is a flowchart of a method of making a multi-pillar sample.

FIGS. 20-21 are flowcharts of additional methods of making multi-pillar samples.

DETAILED DESCRIPTION

Figure 1A:
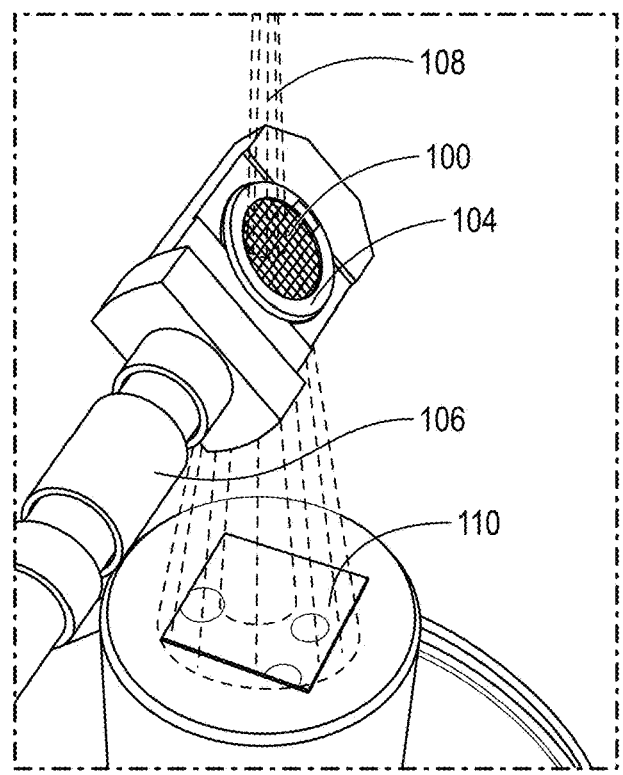
FIG. 1A is an image of a thin lamella sample rotated by a movement stage in view of an transmission electron beam.
Figure 1B:
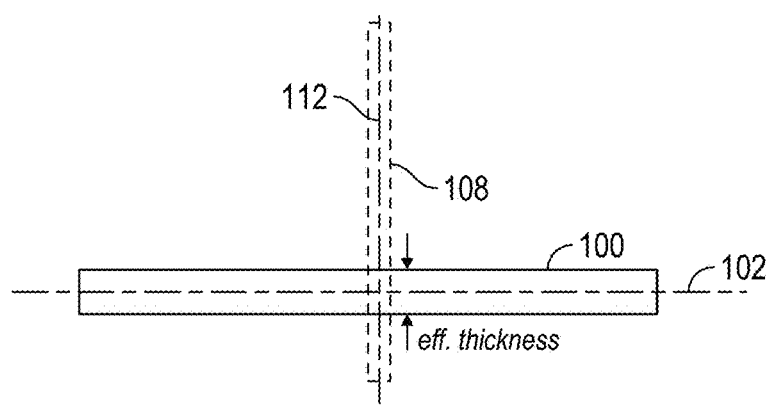
FIGS. 1B-1C are side views of the sample in FIG. 1A at a 0 degree and 70 degree positions, respectively.
Figure 1C:
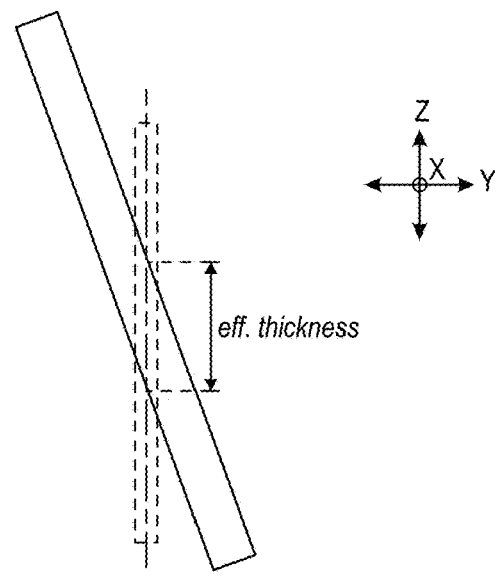
Figure 2A:
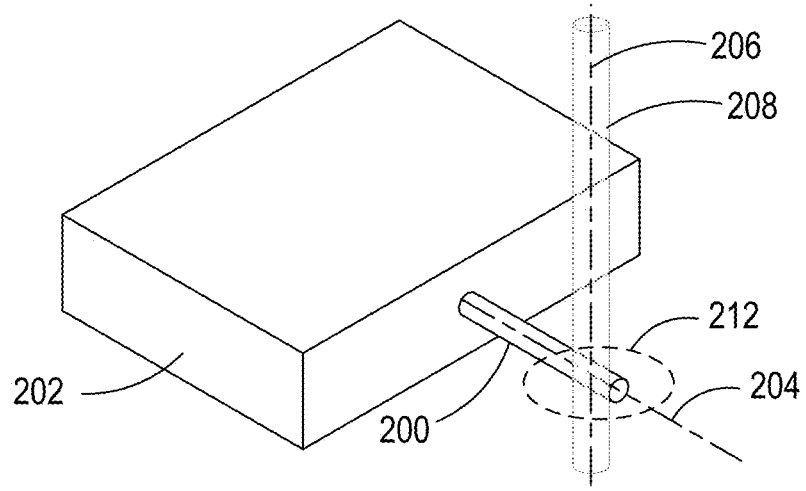
FIG. 2A is a perspective view of a tomographic sample with a pillar extending therefrom.
Figure 2B:
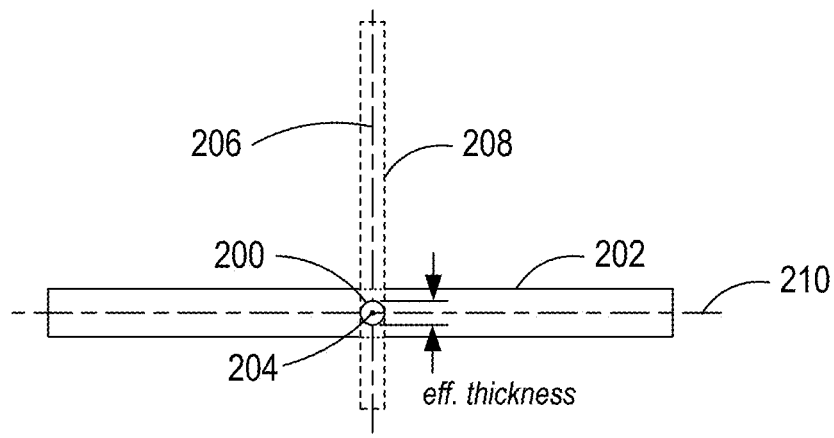
FIGS. 2B-2C are side views of the sample in FIG. 2A at a 0 degree and 70 degree positions, respectively.
Figure 2C:
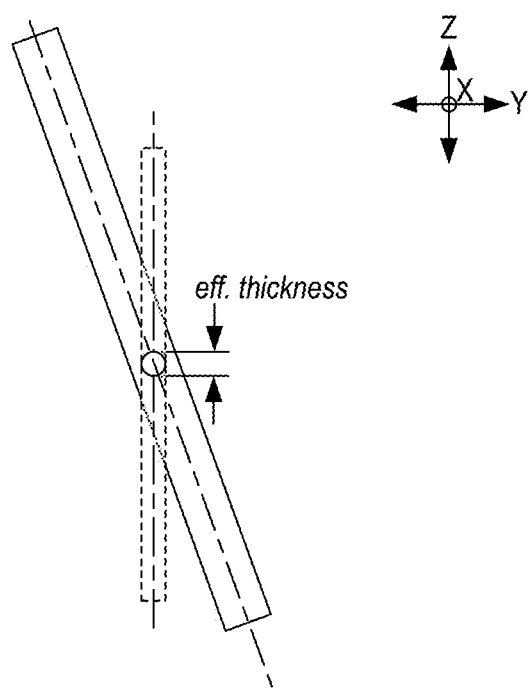

One approach to address these problems can include using a sample pillar 200 extending from a sample substrate 202, shown in FIG. 2A-2C, instead of only a thin 2-D thickness of sample material. The pillar 200 can extend along a pillar axis 204 perpendicular to an axis 206 of an incident imaging beam 208, such as an electron beam or other particle beam. A tilt-series of images can then be acquired as the sample pillar 200 is rotated to various tilt angles about the pillar axis 204. This can reduce or eliminate the edge obstructions caused by the sample carrier and thereby allow a full 360 degree range, or a complete +90/−90 degree range used for acquiring tomographic images of the sample. For example, FIG. 2A shows a sample plane 210 of the sample substrate 202 arranged at a 0 degree position, perpendicular to the incident electron beam 208, and FIG. 2B shows the sample plane 210 arranged at a 70 degree position relative to the 0 degree position. Carriers can be used to provide pillars with spatial clearance for imaging, allowing pillars to supplant thin lamellar grids that can produce edge obstructions. For example, sample pillars can extend in the field of view 212 of the imaging beam 208 without carrier edges substantially interfering with forming or collected images.

Figure 3:
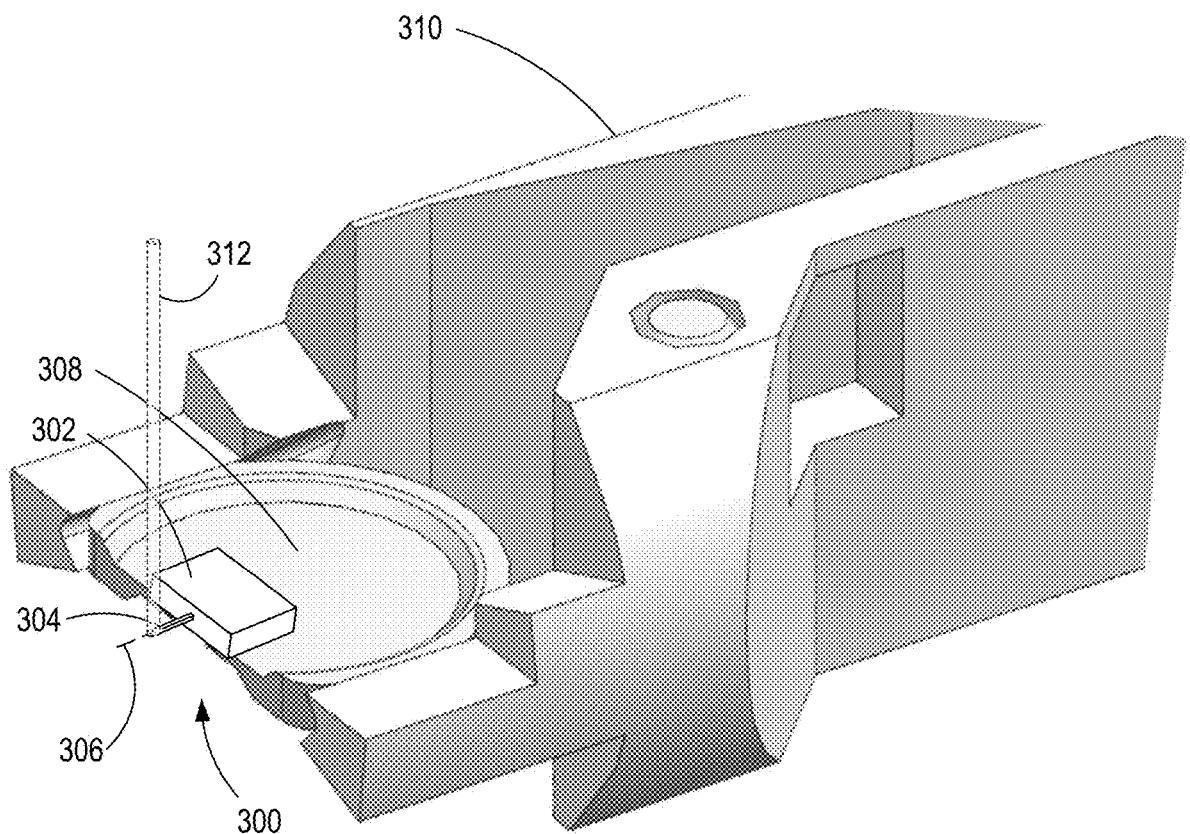
FIG. 3 is a perspective view of a tomographic pillar sample held by a sample carrier and movement stage in a tomographic environment.
Figure 4:
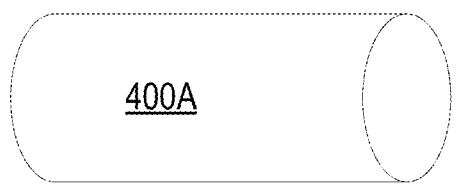
FIG. 4 shows various perspective side views of tomographic pillar geometries extending from respective bases at the left to tips at the right.
Figure 4:
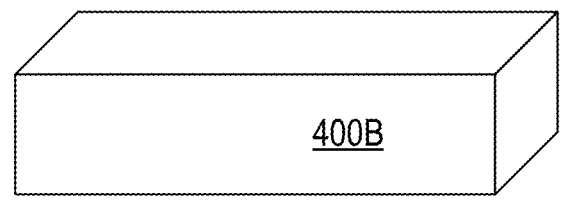
Figure 4:
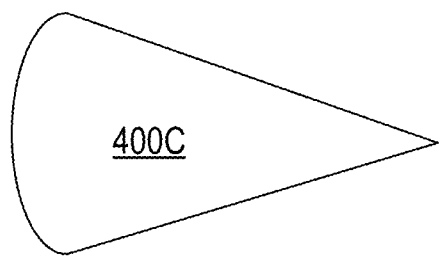
Figure 4:
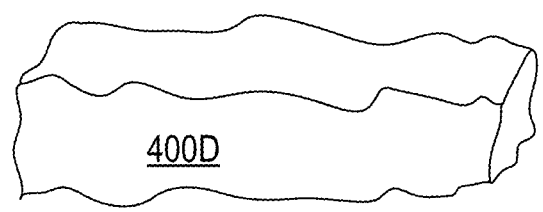
Figure 4:
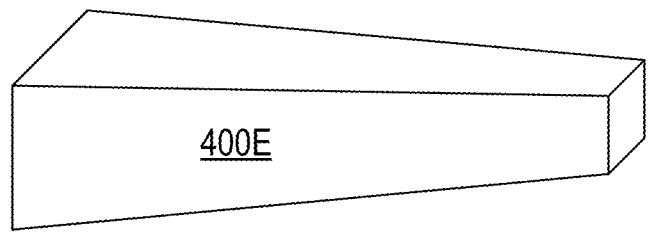
Figure 4:
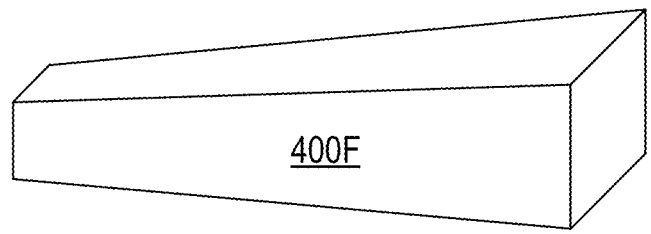

Another example of edge interference avoidance is shown in FIG. 3. A sample 300 includes a bulk substrate 302 and a pillar 304 extending therefrom along a pillar axis 306. The sample 300 is arranged on a base of a carrier 308 that is held by a movement stage 310 which can also be referred to as a sample stage.

The sample 300 can be secured to the carrier 308 in various ways. In representative examples, the sample 300 is attached to the carrier 308 by being frozen from a liquid state, e.g., with a vitrification process such as using high-pressure freezing (HPF). The freezing process can cause the vitrified sample material to become secured to a surface of the carrier 308, which can also define a sample plane for the sample as the sample material generally conforms to the surface of the carrier 308. Adhesion between the frozen material and the carrier can be maintained by appropriate selection of carrier material, carrier geometry, and/or additives to the sample prior to vitrification. For temperature controlled or room temperature samples, bulk sample material can also be attached to the carrier 308 in other ways, such as chemical welding, micro-welding, adhesives, redeposition, etc. A gas injection system (GIS) can be used in some examples, e.g., in which a sample precursor is broken and a beam is scanned over a portion of the sample to produce a weld. Lift-out processes can be used to move sample material by picking up and placing the sample 300 on the carrier 308 using a micro-manipulator arm, e.g., within a FIB/SEM microscope chamber, before or after pillars are formed in the substrate 302. In further examples, the pillar 304 can be attached to the carrier 308 directly without the bulk substrate. In some examples, the sample 300 and carrier 308 can be the same.

The movement stage can be configured to rotate the carrier 308 about an axis aligned with the pillar axis 306 so that an incident imaging beam 312 can be directed through the pillar 304 at various tilt positions about the pillar axis 306 to produce tomographic image slices of the pillar 304.

Pillars can be constructed in various shapes. For example, each pillar can have a height/length defined along the pillar axis and at least a width/thickness defined in a plane perpendicular to the pillar axis. The aspect ratio of the pillar is greater than 1. FIGS. 4A-4D illustrate different pillar shapes, such as cylindrical 400A, conical 400B, tapered 400C, expanding 400D, rectangular 400E, and irregular 400F, though it will be appreciated various other shapes can be provided for tomographic pillar imaging. The pillar shape can be defined in relation to milling processes used to produce the pillar, such as focused ion beam (FIB) milling. Thus, rather than imaging a large and thin sample, a pillar-shaped structure can be imaged.

Figure 5:
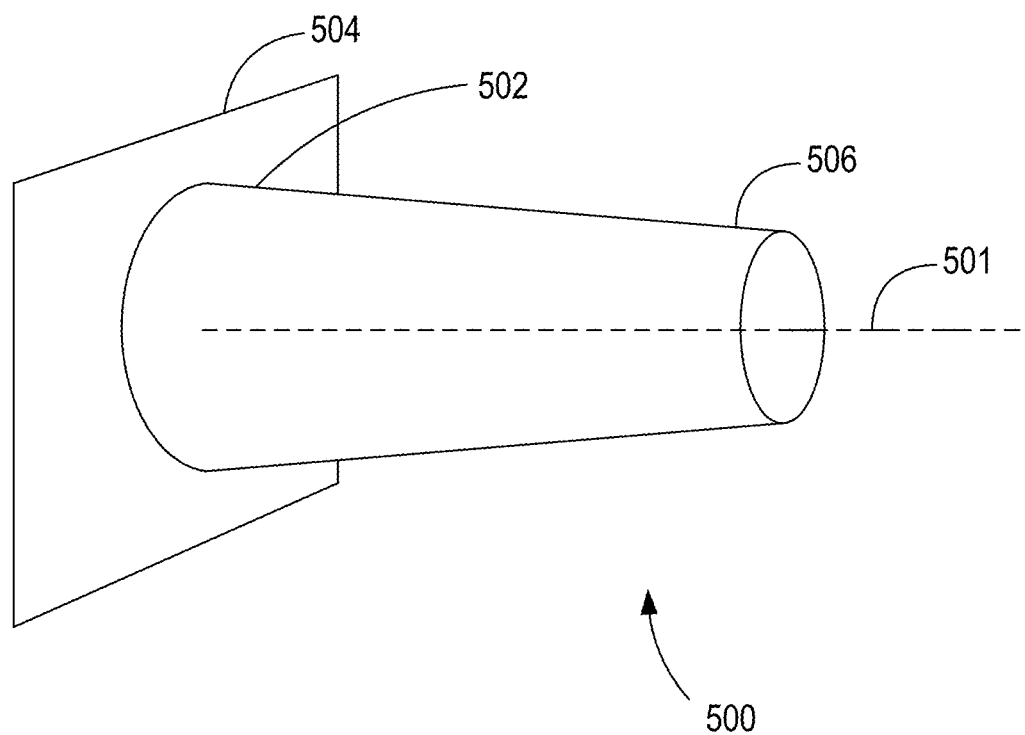
FIG. 5 is a perspective side view of a tapered pillar.

Referring to FIG. 5, a pillar 500 extends along a pillar axis 501 from a base region 502 coupled to a bulk substrate 504 and tapers along all or a portion of the length of the pillar 500 before terminating at a pillar tip region 506. Thus, pillar thicknesses or diameters can vary along the length of different pillar examples and various portions of a pillar can be selected for imaging. In some examples, pillar portions selected for imaging are constrained based on pillar thickness and the imaging capabilities of the incident probe beam, such as particle selection, electron energy, wavelength, etc., with increasing thickness reducing imaging beam transmission through the sample due to absorption, scattering, etc. In some examples, portions of tapered pillars that are used for transmission imaging can have a thickness of tens to hundreds of nm, such as 10 nm, 20 nm, 50 nm, 100 nm, 200 nm, 300 nm, 400 nm, 500 nm, or 600 nm, though other thicknesses can be possible. Pillar bases can have various thicknesses to support pillar extensions, such as 400 nm, 500 nm, 600 nm, 1 µm, etc. Pillar examples can have various lengths along pillar axes, e.g., 100 nm, 200 nm, 500 nm, 1 µm, 2 µm, 5 µm, 10 µm, etc., and can be determined by material or specimen type (e.g., cryogenic, biological, semiconductor, etc.) or FIB milling processes. In general, a larger aspect ratio is preferred, such as a longer pillar and a sufficiently narrow thickness, so as to provide additional sample substance to tomographically image and more distance from potentially interfering objects, such as the coupled sample substrate, the carrier, or movement stage. In some examples, pillars can be severed and transferred from a substrate to another substrate to form a sample, e.g., by attaching a pillar base region to a substrate. In preferred examples, pillars are formed by milling a bulk substrate, which can streamline sample preparation. In some examples bulk substrates can comprise a plurality of separate substrates joined together each with one or more pillars milled into the respective separate substrate.

Even though TEM acquisition characteristics may be enhanced, use of a pillar in tomographic imaging may be less desirable as an alternative to lamella imaging because the amount of material available for imaging and corresponding analysis can be considerably less than a thin lamella sheet which extends substantially in a 2-dimensional sample plane. In order to analyze more material or multiple locations of a bulk substrate, multiple pillars may be imaged. However, preparing and imaging each pillar individually is time consuming, especially when sample preparation and sample imaging are performed in different tools. For example, the pillar is prepared in a FIB-SEM system and the sample is imaged in a TEM. In some examples, the sample may be vitrified in yet another tool.

The above issues may be solved by preparing and imaging a multi-pillar sample. In one example, the multi-pillar sample includes multiple pillars that extend from a substrate. The pillars may be prepared by milling a bulk substrate using a FIB. Alternatively, the pillars may be individually prepared using FIB, then attached to the substrate. In another example, the multi-pillar sample includes multiple pillars attached to a sample carrier. Each pillar may be prepared using a FIB and then attached to the sample carrier.

Tomographic images of one or more cross-sections of each pillar of the multi-pillar sample may be acquired by rotating the sample relative to its pillar axis via the movement stage. The sample rotation range may be at least 80, 90, 100, 110, 120, 130, 140, 150, 160, or 170 degrees. In some examples, the sample rotation range is at least 180 degrees. However, while imaging a selected pillar, the imaging beam can be blocked by other pillars at certain rotation positions. The effect of beam blockage on tomographic imaging may be reduced or minimized by certain pillar arrangements. The multiple pillars may be arranged at different positions along a length of the substrate/sample carrier. The multiple pillars are parallel with each other and may have the same height. In the various multi-pillar examples disclosed herein, the degree to which pillars are considered parallel can be vary according to fabrication tolerances or pillar shapes, e.g., with respective pillar axes forming angles of 0.5 degrees or less, 1 degree or less, 2 degrees or less, 5 degrees or less, 10 degrees or less, 20 degrees or less, etc. In one example, the pillars are positioned near linear along a line. The line may be along the length of the substrate/sample carrier. Alternatively, the line may have a small angle (such as less than 10 degrees) from the length of the substrate/sample carrier.

Figure 6:
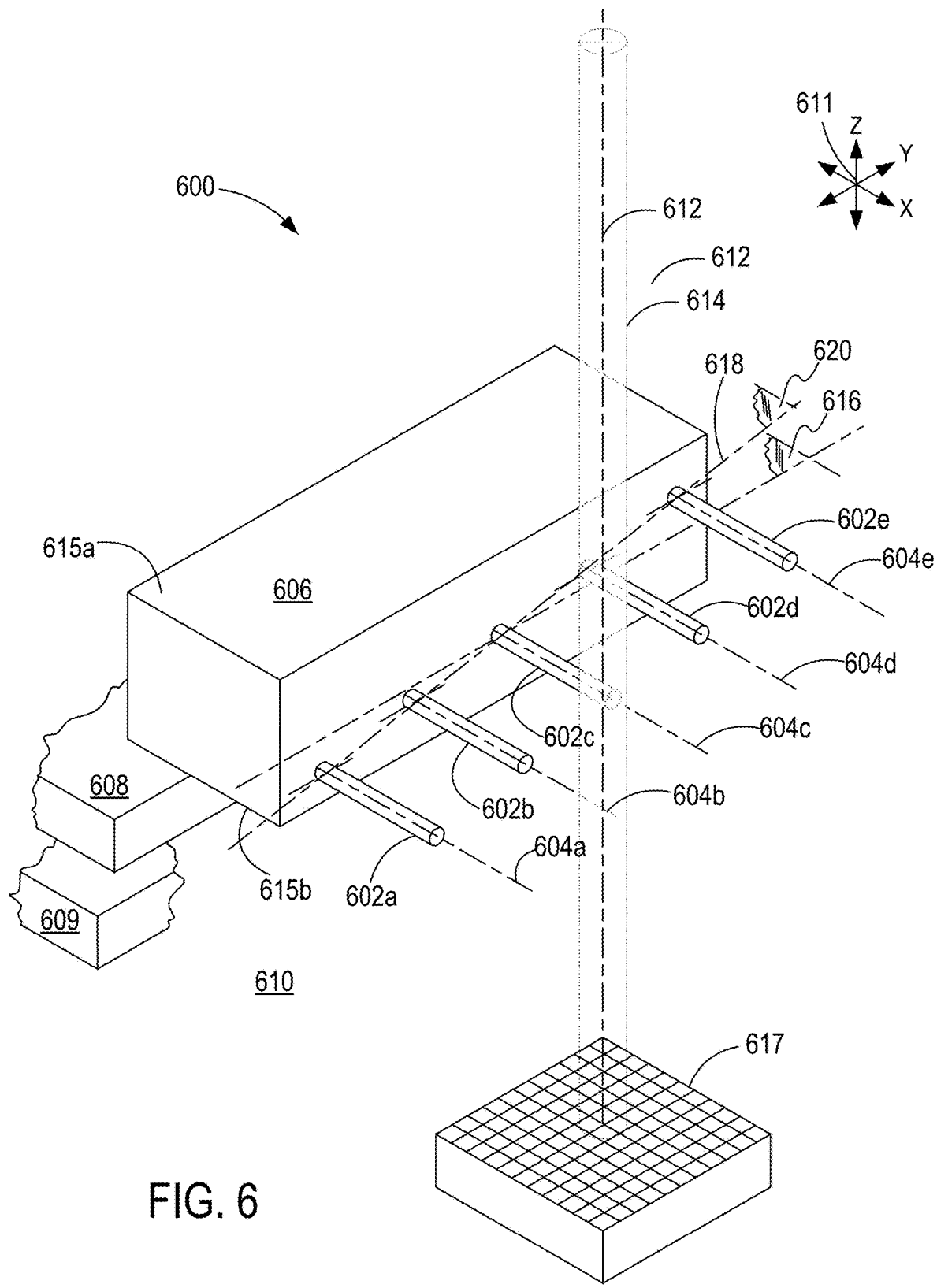
FIG. 6 is a perspective view of a multi-pillar sample arranged in a tomographic environment.

Referring to FIG. 6 there is disclosed an example of a multi-pillar sample 600. The multi-pillar sample 600 includes a plurality of pillars 602a-602e extending along respective axes 604a-604e from a bulk substrate 606. Axes 604a-604e may be parallel with each other. The substrate is defined by a length (Y axis), a width (Z axis), and a height (X axis). The length and height of the substrate defines a sample plane 616. The pillars 602a-602e are arranged in a spaced series with distances separating each adjacent one of the pillars 602a-602e along the length of the substrate 606. The sample 600 can be arranged on a sample carrier 608 coupled to a movement stage 609 in a tomographic environment 610 of a transmission electron microscope, e.g., under vacuum and/or cryogenic conditions. The sample 600 and pillars 602a-602e and tomographic environment 610 are shown arranged relative to coordinate system 611. The coordinate system 611 can be understood as two separate coordinate systems: one for the sample 600 and pillars 602a-602e, and the other for the tomographic environment 610. As shown, the coordinate systems are brought into alignment, with the sample 600 situated in an aligned position in the tomographic environment 610, e.g., with the sample plane 616 perpendicular to an imaging beam axis 612 of an imaging beam 614.

In some examples, the pillars 602a-602e can be arranged in the spaced series such that the pillars 602a-602e are also distributed along the imaging beam axis 612 of the imaging beam 614, e.g., along a z-axis in FIG. 6. Such a distributed spacing can be understood referentially with respect to the sample plane 616 perpendicular to the imaging beam axis 612. The sample plane 616 can be parallel to the X-Y plane and one or more reference surfaces of the bulk substrate 606, such as top and/or bottom surfaces 615a, 615b. For example, the sample 600 can be positioned on the sample carrier 608 so that the sample plane 616 is parallel with a lateral extent or reference surface of the sample carrier 608 and/or perpendicular to the imaging beam axis 612 with the movement stage 609 holding the sample carrier 608 at a 0 degree position. As shown, the imaging beam 614 is directed through pillar 604c to an imaging sensor 617, such as a pixelated array of CCD or CMOS sensors.

In representative examples, the spaced series of pillars 602a-602e is arranged in a line 618. As shown in FIG. 6, the axes 604a-604e extend parallel to each other in the spaced series and to the sample plane 616. The axes 604a-604e can intersect the line 618 to form a reference pillar plane 620 rotated about the axis 604c form a small angle with respect to sample plane 616. Where other size and spacing criteria are met (discussed further below), the spaced distribution along the z-axis associated with the small angle can allow the sample 600 to be rotated to +/−90 degree positional extrema while avoiding shadows or obstruction by adjacent pillars during image acquisition of a particular one of the pillars 602a-602e. Example small angles can be between about 0 degrees and 2 degrees, 0.5 and 1.5 degrees, 1 and 3 degrees, 2 degrees and 4 degrees, 4 degrees and 6 degrees, 6 degrees and 8 degrees, 8 degrees and 10 degrees, or larger in some cases. In some examples, obstructing angle ranges can be avoided during collection or discarded during post-collection tomographic image reconstruction.

In some examples, the small angle between planes 616, 620 can be zero and specific images captured at extreme positions can be discarded where obstruction is present. In such cases, the line 618 can be parallel with the sample plane 616 and/or perpendicular to the imaging beam axis 612 with the sample 600 held at a 0 degree position.

In some examples, the line 618 can be parallel to or at a predetermined angle with respect to the sample plane 616 or another reference surface of the sample 600 or carrier 608, and the movement stage 609 can adjust rotation and translation of the sample 600 so that a 0 degree position for imaging is provided such that the line 618 is arranged at a small angle with respect to a line perpendicular to the imaging beam axis 612. Similarly, the movement stage 609 can adjust rotation and translation of the sample 600 so that the line 618 is perpendicular to the imaging beam axis 612, i.e., without a small angle.

During imaging acquisition, the sample 600 is rotated by the movement stage 609 about the pillar axis of the pillar being imaged, which can correspond to a eucentric axis of the movement stage 609. For example, as shown in FIG. 6, the sample 600 can be rotated about pillar axis 604c to acquire a tilt-series of images for pillar 602c. Because of the spaced series arrangement, as the sample is rotated close to a +90 or −90 degree position, adjacent pillars 602b, 602d produce little obstruction of the image acquisition of the pillar 602c. After imaging acquisition of pillar 602c, the movement stage 609 can reposition the sample 600 to rotate about a new pillar axis, such as pillar axis 604d, and a tilt series of images can be acquired for the pillar 602d. Again, due to the spaced series arrangement, adjacent pillars 602c, 602e produce little obstruction of the image acquisition of the pillar 602d throughout the tilt range of +90/−90 degrees.

The spacing between adjacent pillars is preferably substantially larger than a thickness of the pillars 602a-602e in an imaging region of interest, e.g., closer to the pillar tips or at a sufficiently tapered section that allows imaging beam transmission. A larger distance between adjacent pillars can ensure that any overlap that occurs in the path of the imaging beam 614 is confined to a small angular range. For example, distances between adjacent pillars (which need not be identical between each pair of adjacent pillars) can be in the range of 20-50 µm, 50-100 µm, 100-200 µm, 200-400 µm, or 400+ µm, though other distances may be suitable. In a particular example shown in FIG. 8, two adjacent pillars having 400 nm diameter at imaging cross-sections are 50 µm from each other, resulting in an angle overlap of 0.46 degrees. In many tomographic acquisitions, such an overlap can represent a negligible loss of information. For example, in many tomographic examples, tilt-step increments can be selected in the range of approximately 1-3 degrees, which can result in zero or minimal decrease in image quality for images acquired angularly proximate the obstruction or overlap. Example angular overlaps can include less than about 0.1 degrees, 0.25 degrees, 0.5 degrees, 1 degree, 1.5 degree, 3 degrees, or 5 degrees. In some examples of TEM systems, carriers can have an available width of less than about 750 µm, such that a 50 µm spaced series distribution between pillars can allow for up to 15 pillars to be placed per carrier. In various examples, ratios of adjacent pillar distance to pillar thickness can be at least about 20 or greater, 30 or greater 50 or greater, 100 or greater, 150 or greater, 200 or greater, or 500 or greater. Example ratios can be determined by sample type and preparation, such as available milling processes and sample fracture strength.

The linear arrangement of the spaced series of pillars 602a-602e also reduces the amount of overlap during tilt-series image acquisition, as the closer in-line the pillars 602a-602e are along the line 618, the smaller the size of any angular shadow cast by adjacent pillars. Thus, by arranging the spaced series linearly where any overlap occurs it will occur for all pillars at one time, resulting in no more loss of information than if there were only two pillars, defining the loss of information by only the neighboring pillars. Further, because images are typically acquired for a particular pillar, adjacent pillars angularly proximate to causing obstruction are also defocused, which can further reduce the effects of adjacent pillars on imaging quality. It can generally be difficult to arrange the pillars 602a-602e such that the line 618 is perfectly straight. Thus, described lines and linear arrangements can deviate from an ideal line by various ranges or amounts. For example, example lines including three or more pillars can have a thickness or variation corresponding to 0.5, 1, 5, 10, or 50 pillar diameters. In some examples, the distance of each pillar from the line is within 10 or 50 pillar diameters. In some examples, a third pillar of a group of three pillars is sufficiently distant from a line intersecting the other two pillars such that separate lines can be defined between each of the two pillars and the third pillar.

As discussed above, in some examples the pillars 602a-602e can be spaced along the z-axis. Such a spacing can require a small translation of the sample 600 by the movement stage 609 in the z-direction along the imaging beam axis 612 where the sample 600 is repositioned to acquire a series of tilt images for a newly selected pillar that replaces a previous pillar as an axis of rotation. By providing a spacing along the direction of the imaging beam axis 612 together with the spacing laterally, i.e., perpendicular to the imaging beam axis 612 at a 0 degree rotational position, then the full field range of −90/+90 can be reached for each of the pillars 602a-602e. While it is possible some information may be lost between −90 and +90, it can be beneficial to acquire information for images at the angular extrema. It is also beneficial to acquire images from as many different image projections as possible. For example, if a particular projection is more different than other projections, obtaining the particular projection can provide more overall information for the 3D tomographic reconstruction as compared with fewer projections or more projections in a smaller or limited angular range. In some examples, other rotational ranges can be used, e.g., based on information sufficiency for a particular sample, movement stage constraints, housing constraints, sample carrier geometry, etc. Rotational ranges of ±180 degrees, ±150 degrees, ±120 degrees, ±100 degrees, ±95 degrees, ±85 degrees, ±80 degrees, ±70 degrees, ±60 degrees, ±50 degrees, or ±40 degrees can also be used in some examples. Some rotational ranges can include non-symmetric ranges, e.g., +90/−40, +95/−85, +40/−90, +70/−75, etc.

As discussed above, multi-pillar samples can be produced using various FIB techniques, and different samples types can define geometries, spacing, and other characteristics of the pillars produced. In some examples, pillars are produced from bulk samples prepared by high-pressure freezing (HPF). By producing more pillars on the sample where a single pillar might normally be used, the number of multi-pillar samples that can be made to obtain a similar amount of data as a set of single-pillar samples can be substantially reduced, thereby reducing the time, cost, and difficulty in producing, sample staging, carrier exchanging, and tomographic imaging of multiple separate samples. Moreover, required carrier exchange complicates automating of the data acquisition. Besides that, as two samples are never prepared using at the exactly same conditions, we can assume it will have negative impact on consistency of analyzed data. Thus, with disclosed examples, even with standard TEM carrier-pillar sample dimensions, sample overlap obstruction that may occur during TEM acquisition can be made negligible. At the same time, the imaging throughput is significantly increased while conserving the 360° range associated with pillars.

Figure 7:
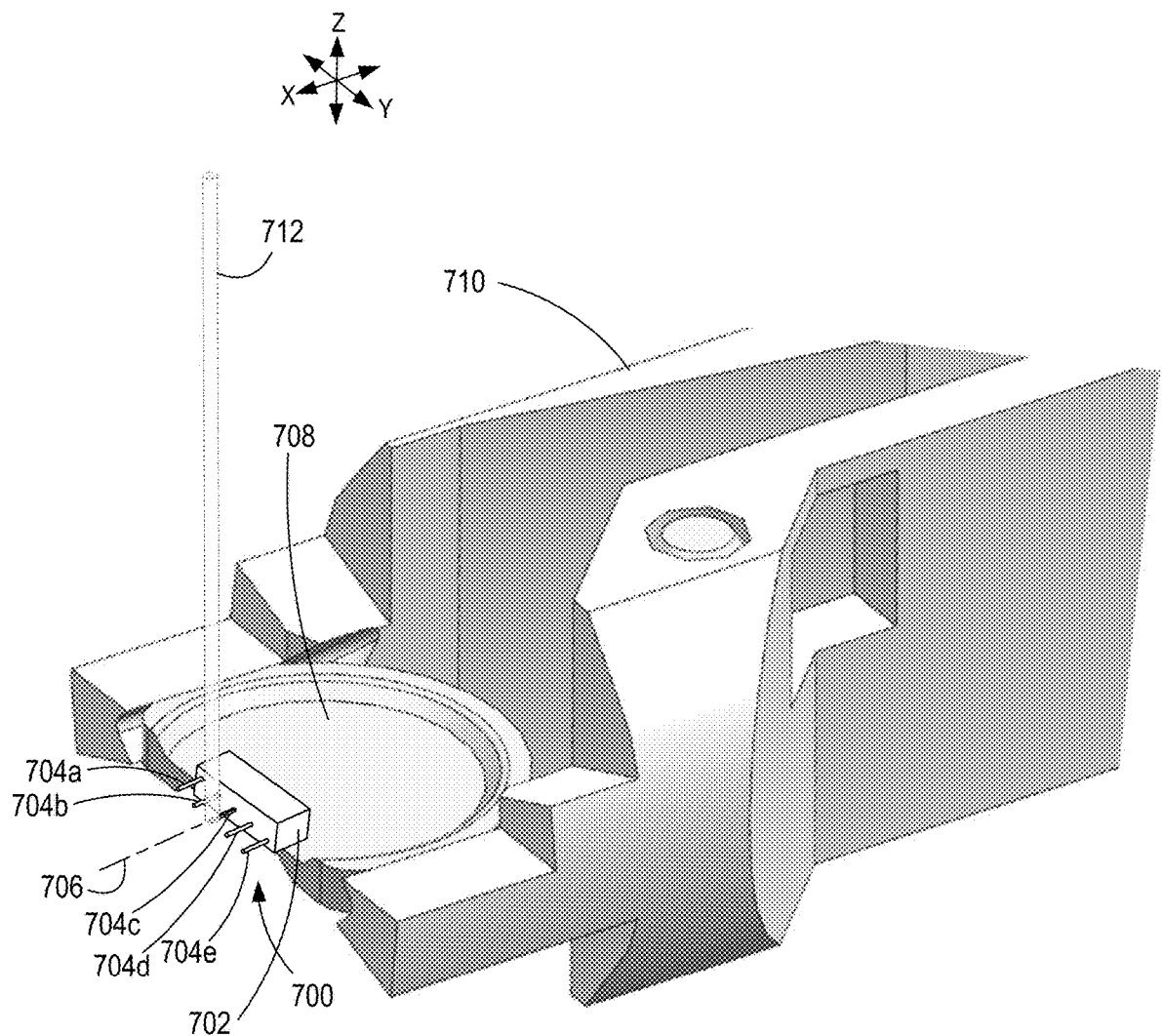
FIG. 7 is a perspective view of a multi-pillar sample held by a sample carrier and movement stage in a tomographic environment.

FIG. 7 is a tomographic environment supporting a multi-pillar sample 700. The sample 700 includes a bulk substrate 702 and a plurality of pillars 704a-704e extending from the substrate 702. The sample 700 is arranged on a carrier 708 that is held by a movement stage 710. The sample 700 can be secured to the carrier 708 in various ways, as discussed previously. The movement stage 710 can be configured to rotate the carrier 708 about axes of the respective pillars 704a-704e so that an incident imaging beam 712 can be directed through the respective pillars 704a-704e, e.g., by sequentially acquiring image series at a sequence of tilt angles for each pillar 704a-704e.

Figure 8:
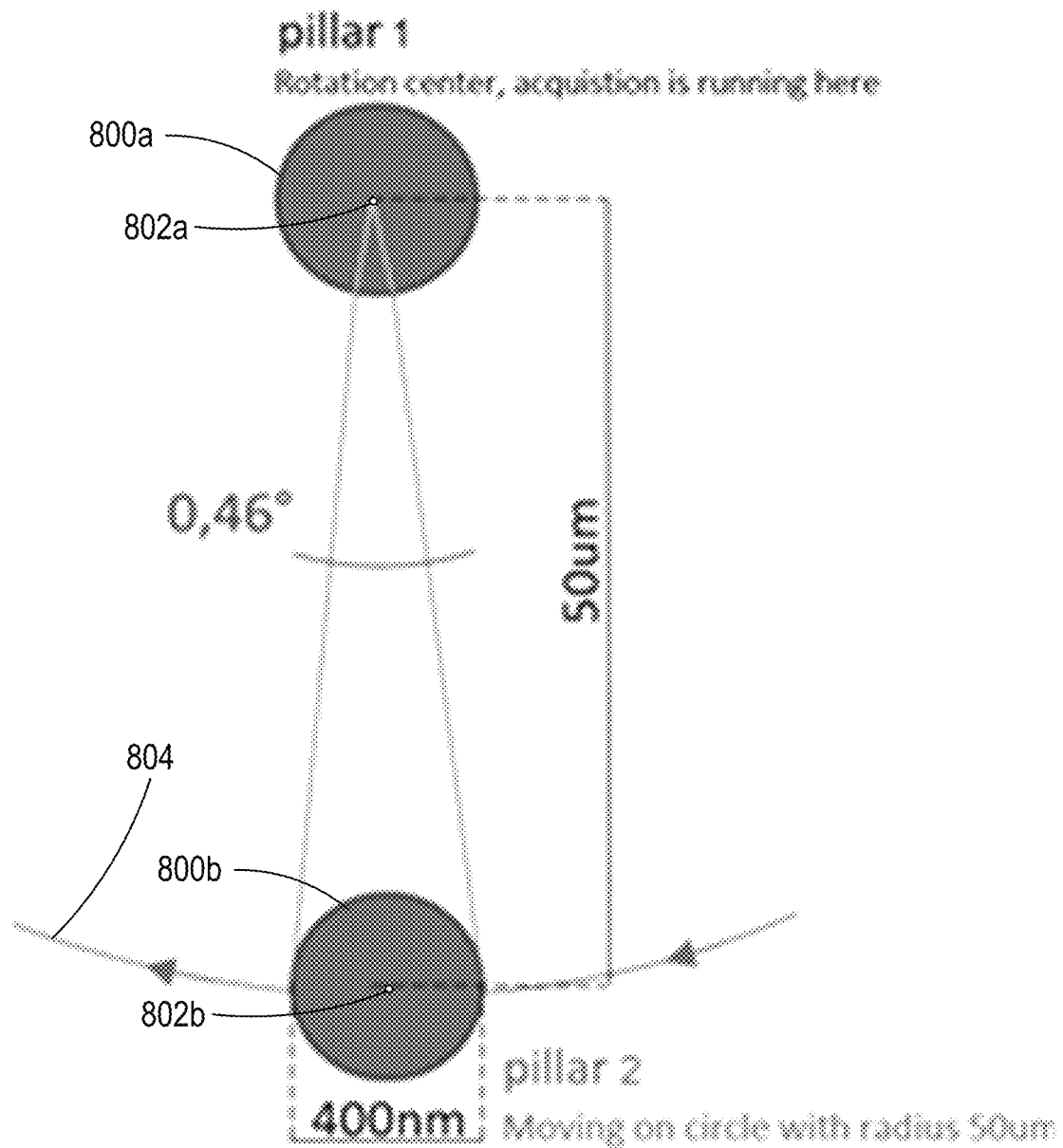
FIG. 8 is a side view of two pillars of a multi-pillar sample.

FIG. 8 is a set of pillars 800a, 800b of a multi-pillar sample viewed on-end, with the pillars extending out of the plane of the figure along respective axes 802a, 802b. The pillars 800a, 800b have respective diameters of approximately 400 nm and are spaced apart from each other by a distance of 50 μm. Pillar 800a is imaged through a tilt-series of tomographic images by rotating about the axis 802a. The rotation about the axis 802a, the position of the pillar 800 travels along an arc 804. With the pillar cross-sectional size and distance between pillars, each pillar overlaps the other by about 0.46 degrees, which is an example amount by which tomographic imaging obstruction can be avoided with suitable tilt-series angular increments.

Figure 9:
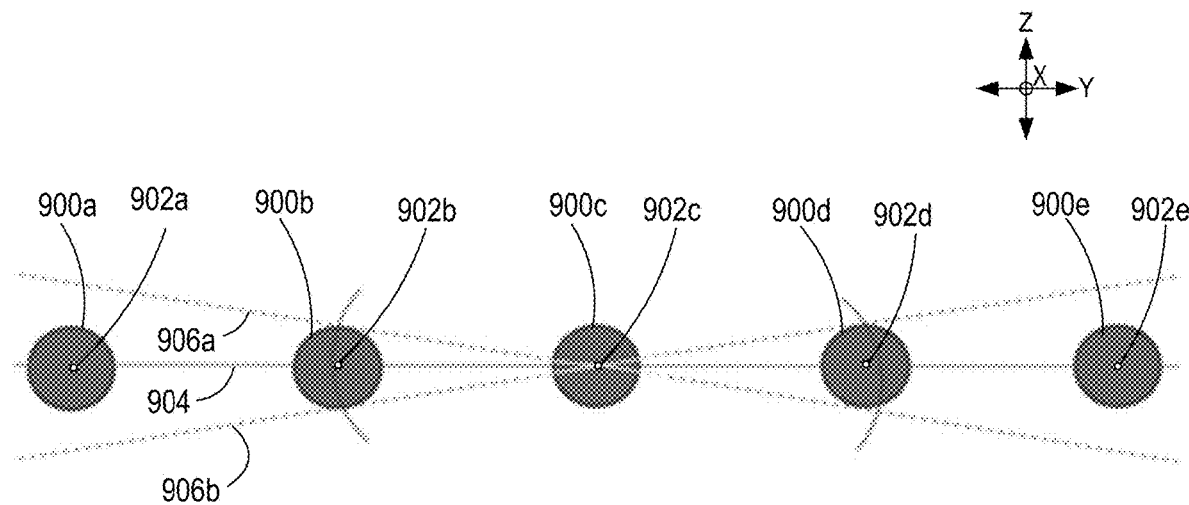
FIG. 9 is a side view of five pillars of a multi-pillar sample.

FIG. 9 is a set of pillars 900a-900e of a multi-pillar sample viewed on-end, with the pillars extending out of the plane of the figure along respective pillar axes 902a-902e. The pillars 900a-900e are generally arranged along a line 904 to reduce the amount of overlap or shadow effects at certain tilt-series angles that are caused by adjacent pillars not being currently imaged. For example, when rotating about axis 902c during image acquisition of pillar 900c, lines 906a, 906b show the angular extent to which adjacent pillars 900b, 900d can obstruct imaging at certain tilt angles, e.g., near +90 or −90 degree imaging positions.

Figure 10:
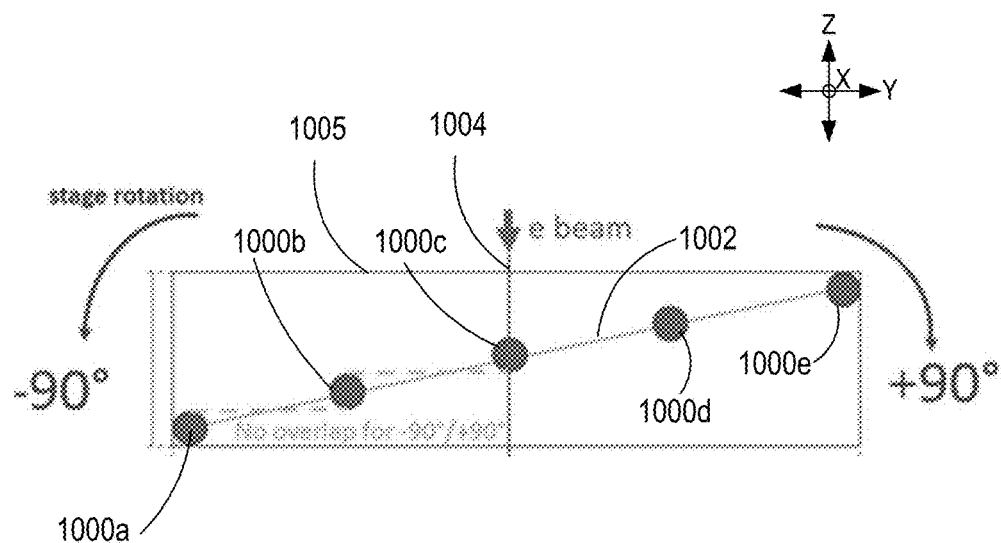
FIG. 10 is a side view of a multi-pillar sample with five pillars arranged along a line at a slight angle with respect to the normal of an incident electron beam.

FIG. 10 is a set of pillars 1000a-1000e of a multi-pillar sample viewed on-end, with the pillars extending out of the plane of the figure. In order to increase an angular range for acquiring tomographic images for each of the pillars 1000a-1000e, the pillars 1000a-1000e are arranged in a line 1002 and spaced apart at different locations along the length (Y axis) of substrate 1005. The pillars may also be spaced apart along the width (Z axis) of the substrate. When the multi-pillar sample is positioned at a 0 degree position in the imaging system as shown in FIG. 7, the sample's X-Y plane may be aligned with or correspond to the sample plane, and the substrate's width (Z axis, vertically in the FIG. 10) is aligned with the direction of an incident electron imaging beam 1004. In particular, the vertical spacing (along the Z axis) is selected such that each pillar is shifted relative to their adjacent pillars by at least a distance corresponding to their thickness or diameter, e.g., so that a top of one pillar is not higher than the bottom of an adjacent pillar. By spacing the pillars 1000a-1000e vertically, tomographic images can be acquired by rotating the multi-pillar sample with a sample stage in a range −90° to +90° relative to the pillar axis for each pillar, including projections at the extreme positions of −90 and 90 degrees. The slope of the line 1002 relative to the sample plane can be selected based on a selected acquisition scheme. For example, slope can determine at what angular ranges image obstructions occur due to pillar overlap, and some pillar samples can benefit from reduced obstruction at selected imaging angles or ranges of imaging angles. Thus, an acquisition scheme and corresponding slope can be selected to benefit a particular pillar material, geometry, or arrangement of the sample. For example, the slope may be determined based on the rotation range of the sample stage, the arrangements of the pillars relative to the sample plane, and/or pillar size.

Figure 11:
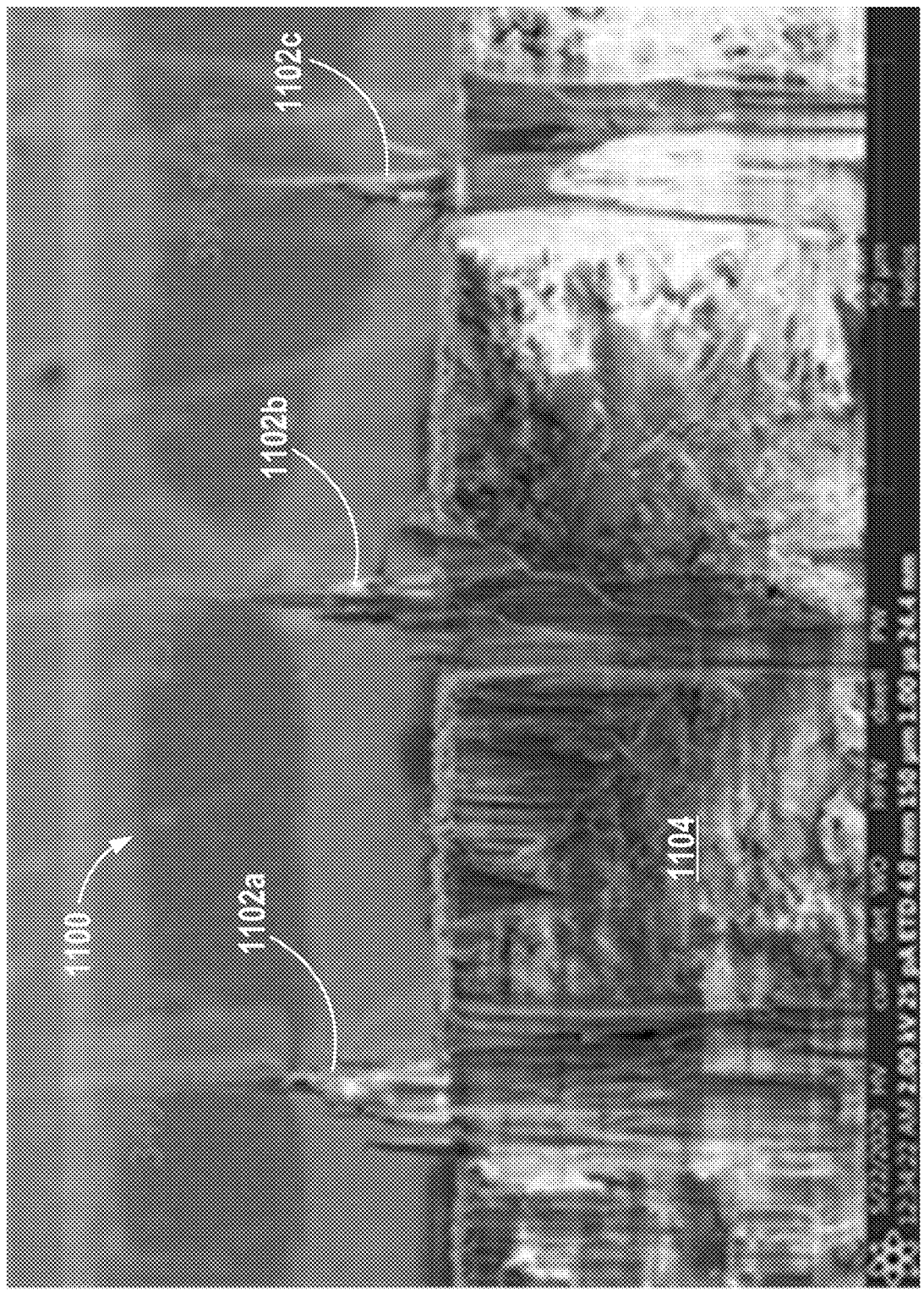
FIGS. 11-12 are images of a multi-pillar sample obtained with an electron microscope.
Figure 12:
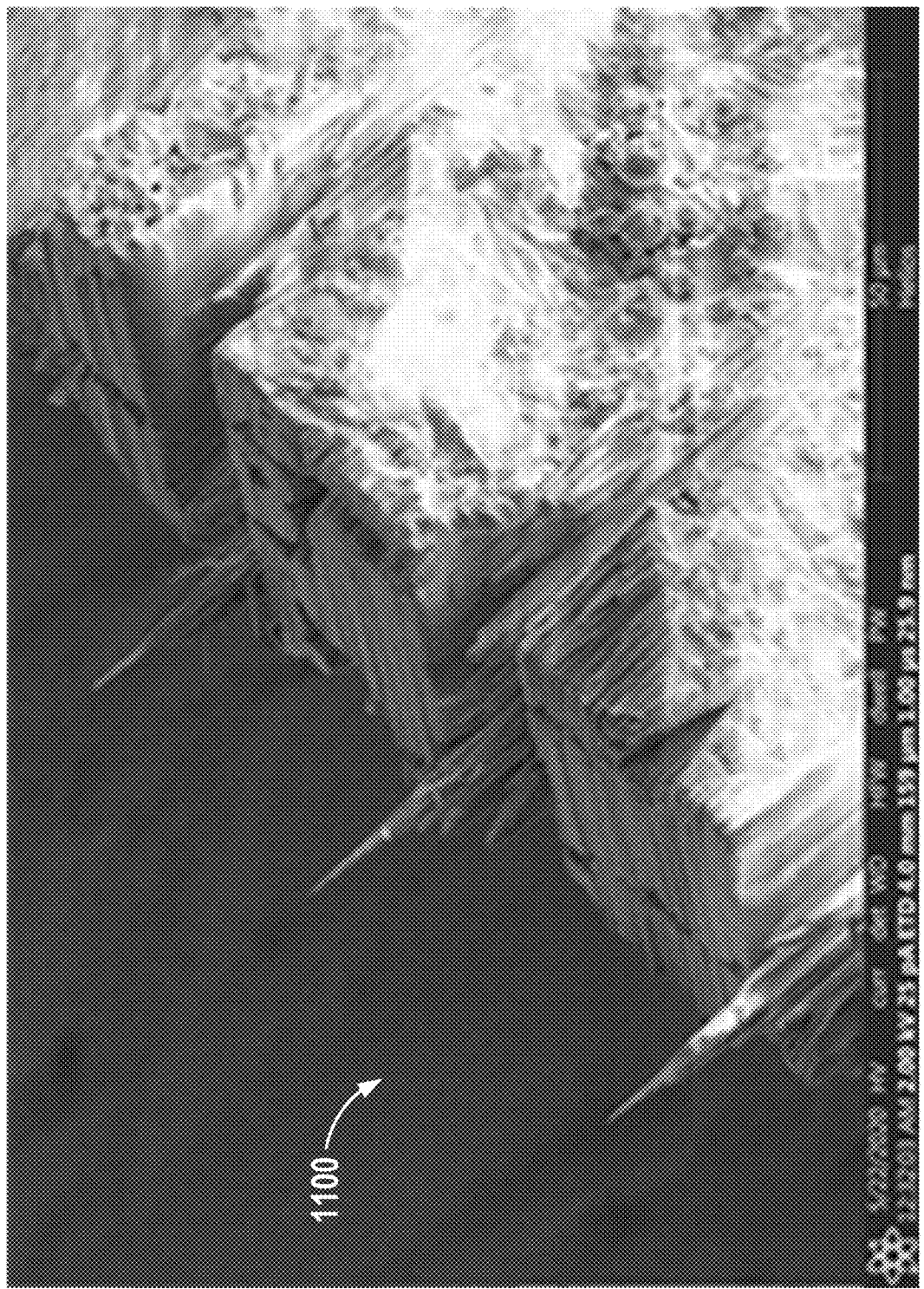

FIG. 11 is an image of a multi-pillar sample 1100 having three tapered pillars 1102a-1102c extend from a bulk substrate 1104. The pillars 1102a-1102c were formed by milling the bulk substrate 1104 with a focused ion beam. FIG. 12 is an image of the same multi-pillar sample 1100 from an alternate angle.

Figure 13:
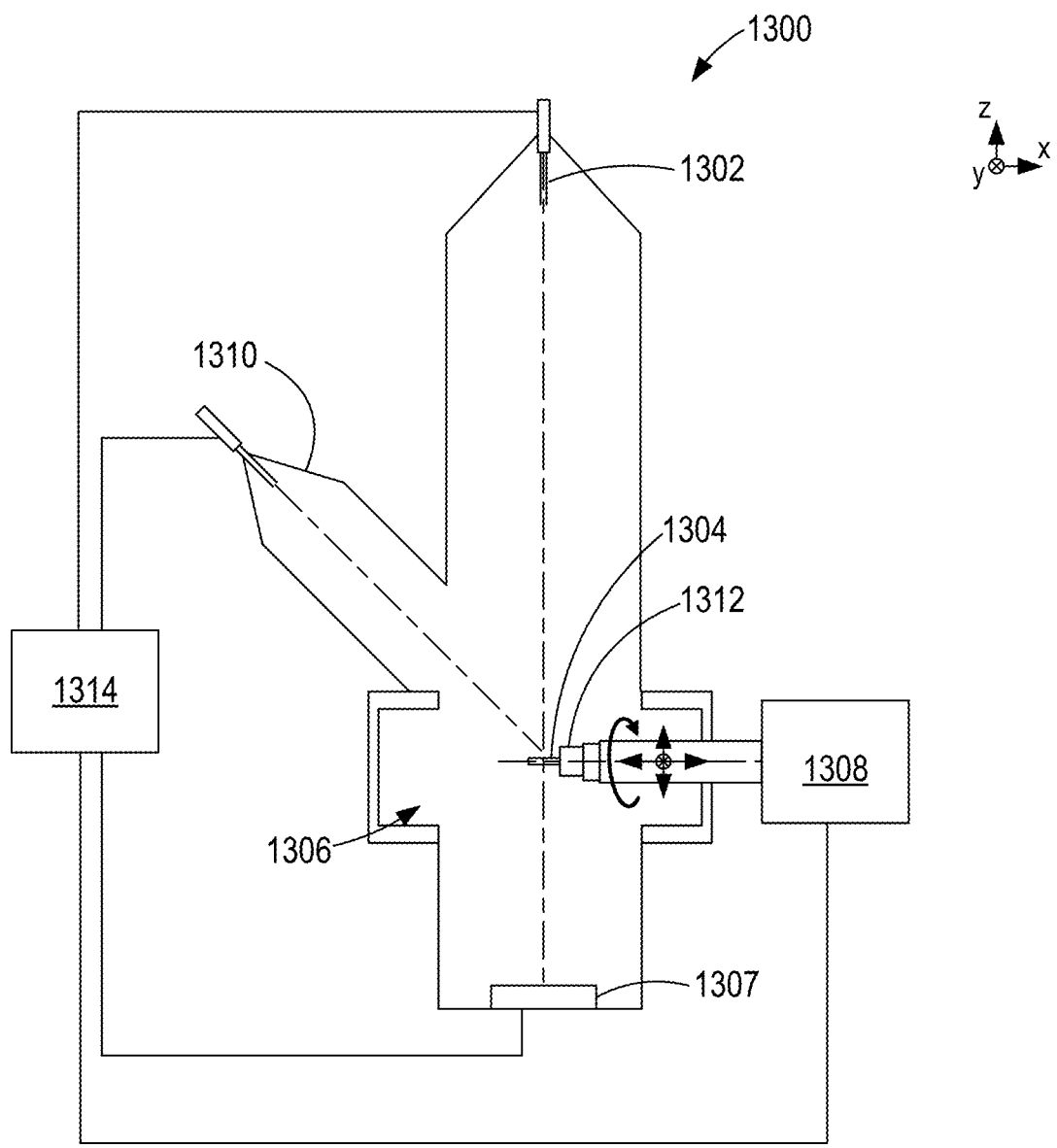
FIG. 13 is a schematic of an electron microscope with an optional focused ion beam column.

FIG. 13 is an example imaging system that includes a charged particle microscope 1300 that is configured to produce a tomographic imaging beam 1302 of electrons and to direct the imaging beam 1302 to multi-pillar sample 1304 situated in a sample chamber 1306. In representative examples, the housing chamber is cryogenically cooled to perform cryogenic electron tomography on the multi-pillar sample 1304. Example imaging systems can direct the imaging beam 1302, e.g., in the form of an electron beam or other charged particle beam, through the sample 1304 to collect transmitted particles to form images at an imaging sensor 1307. The microscope 1300 includes a movement stage 1308 configured to rotate the multi-pillar sample 1304 about various pillar axes to acquire respective tilt series of images for the different pillars of the sample 1304. In some examples, the microscope 1300 can include a focused-ion beam FIB column 1310 that can be used to mill a bulk substrate 1312 of the multi-pillar sample 1304 to produce the pillars before tomographic imaging. The microscope 1300 can be controlled with a control environment 1314 configured with at least a processor and memory stored with computer executable instructions to operate the movement stage and various microscope components so that the multi-pillar sample 1304 can be tomographically imaged and/or milled to produce its pillars.

In some examples, the microscope 1300 can be a FIB or FIB/SEM system in which the multiple pillar sample may be prepared and transferred to a TEM system for tomographic imaging. In some examples, the microscope 1300 can be a FIB/SEM or FIB/TEM in which the multiple pillar sample can be both prepared and tomographically imaged. In further examples, a SEM system can be used to tomographically image a multiple pillar sample. Examples in which multiple pillar samples are prepared and imaged in a common location, e.g., in the same device or chamber, can simplify the imaging process by avoiding realignment steps or additional movement stage manipulation.

For example, control components can include desktop or laptop computers, mobile devices, tablets, logic controllers, etc. Processors can include CPUs, GPUs, ASICs, PLCs, FPGAs, PLDs, CPLDs, etc., that can perform various data processing or I/O functions associated with the controller environment 128, such as control and/or data processing. Memory can be volatile or non-volatile (e.g., RAM, ROM, flash, hard drive, optical disk, etc.), fixed or removable, and is coupled to the processor. The memory can provide storage capacity for one or more computer-readable media. The controller environment 1314 can also be situated in a distributed form so that applications and tasks are performed by remote processing devices that are linked through a communications network. Program modules and logic can be located in both local and remote memory storage devices. In some examples, components in the controller environment 1314 need not be linked with other components.

Pillar image acquisition algorithms or steps, and pillar substrate milling algorithms or steps, can be embodied as software or firmware instructions carried out by a digital computer. For instance, any of the disclosed techniques can be performed by a computer or other computing hardware that is part of or coupled to a TEM and/or FIB system. For instance, software for performing any of the disclosed embodiments can be stored on the one or more volatile, non-transitory computer-readable media as computer-executable instructions, which when executed by the one or more processors, cause the one or more processors to perform any of the disclosed techniques. The results of the image acquisitions, computations, or reconstructions can be stored (e.g., using suitable data structures or lookup table) in the one or more tangible, non-transitory computer-readable storage media and/or can also be output to the user, for example, by displaying data, images, tomographic image slice, 3D reconstructions, etc., on a display.

In some examples, tomographic reconstructions of one or more pillars can be performed. In many instances, reconstructions can be performed locally and/or remotely, e.g., in a distributed computing environment, to improve processing speeds or address onerous computational loads. Various tomographic reconstruction techniques can be employed, including iterative approaches, search, expectation maximization, weighted back-projection, etc. Images can be stored and resorted where necessary so that the acquired image sequences can be tailored or adapted to standard reconstruction techniques.

Figure 14:
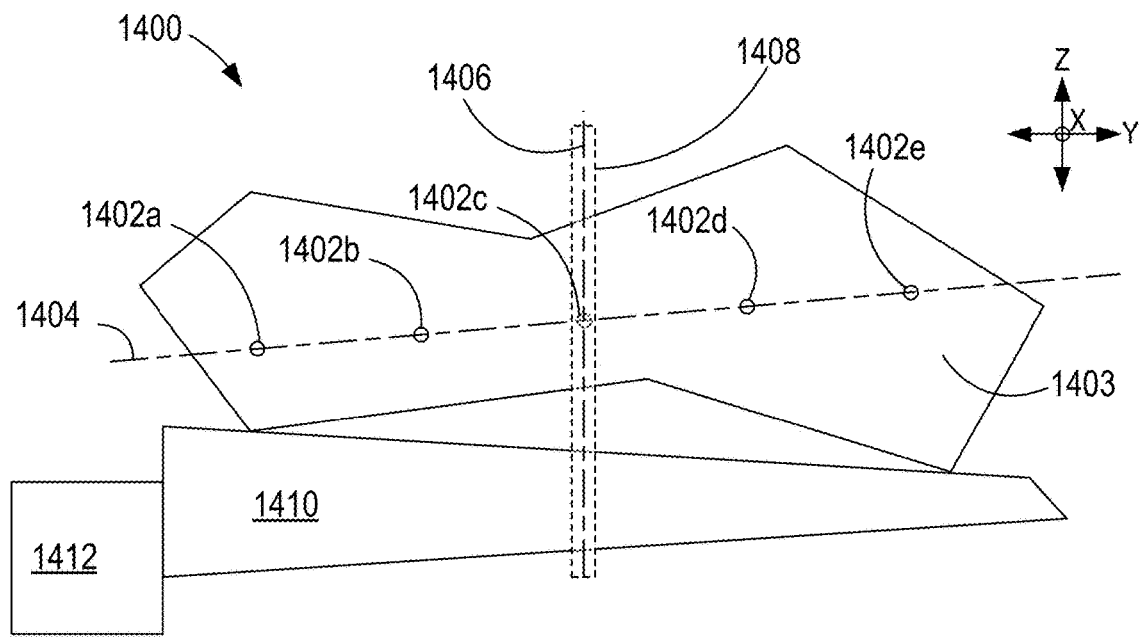
FIG. 14 is a side view of an irregularly shaped multi-pillar sample and sample carrier.

FIG. 14 is a multi-pillar sample 1400 including a plurality of pillars 1402a-1402e viewed on-end with the pillars extending out of the plane of the figure from a bulk substrate 1403. The pillars 1402a-1402e are arranged in a line 1404 and preferably at a slight angle to a y-axis with the sample 1400 arranged at a 0 degree position (that is, perpendicular to e-beam) for tomographic imaging. The y-axis is perpendicular to a z-axis which is parallel to a propagation axis 1406 of an incident imaging beam 1408. The sample 1400 is coupled to a carrier 1410 which is supported by a movement stage 1412. One or more surfaces of the sample 1400 and/or carrier 1410 can include irregular surfaces making alignment difficult. The movement stage 1412 can be configured to adjust the positioning of the sample 1400 so that the line 1404 and pillars are arranged for tomographic imaging. In representative examples, the line 1404 is arranged at a slight angle at the 0 degree position so that border +90 and −90 degree positions can be imaged without obstruction by adjacent pillars. In some examples, the line 1404 can be arranged without an angle or another angle at the 0 degree position for tomographic imaging.

Figure 15:
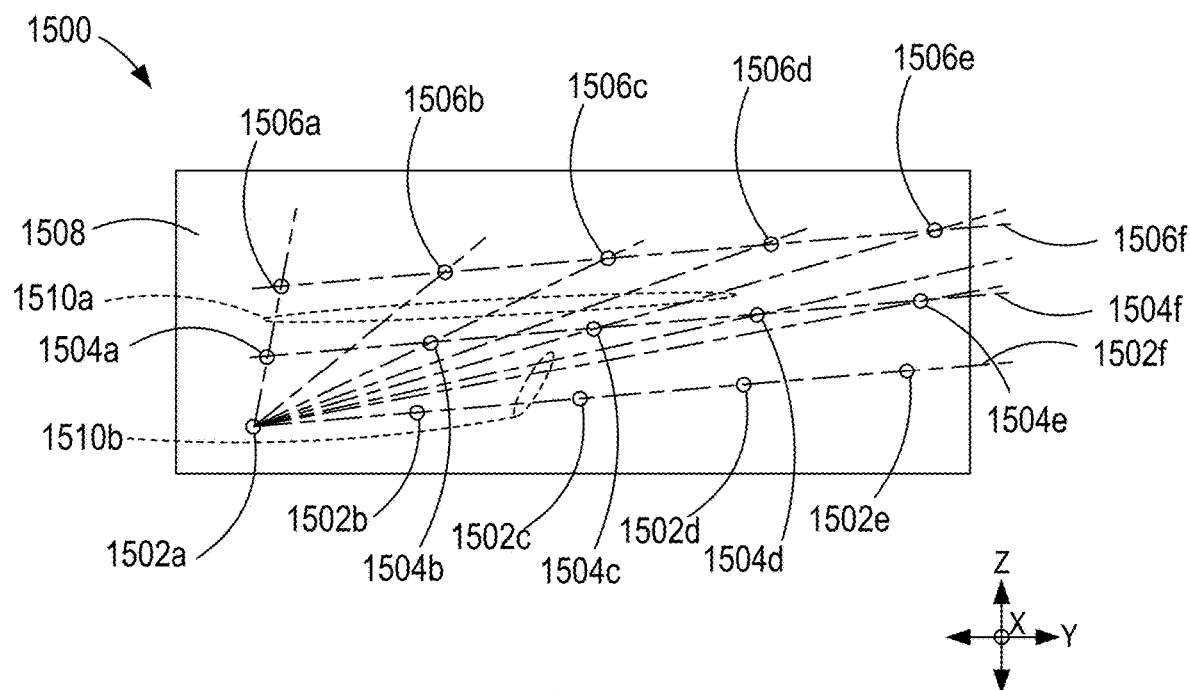
FIG. 15 is a side view of a multi-pillar sample with pillars arranged in a grid.

FIG. 15 is a multi-pillar sample 1500 including a plurality of sets pillars 1502a-1502e, 1504a-1504e, 1506a-1506e viewed on-end with the pillars extending out of the plane of the figure from a bulk substrate 1508. Each of the pillar sets 1502a-1502e, 1504a-1504e, 1506a-1506e can be arranged along respective lines 1502f, 1504f, 1506f so that fewer rotational angles during tomographic imaging can cause an obstruction due to adjacent pillars within sets. The pillar sets 1502a-1502e, 1504a-1504e, 1506a-1506e can be arranged in a grid pattern with a sufficient distance between pillars so that obstruction by pillars at various angular positions during tilt-series tomographic imaging can be reduced. For example, rotational positions for pillar 1502a associated with an obstruction, e.g., along intersection lines 1510a, 1510b, 1502f, can be adjusted to avoid or reduce a negative impact on imaging quality.

FIG. 16 is a method 1600 of producing a multi-pillar sample, which can include placing a bulk substrate on a focused-ion beam (FIB) sample stage at 1602, and directing the FIB to the sample to selectively remove material until a plurality of pillar extensions remain on the bulk substrate at 1604.

Figure 17:
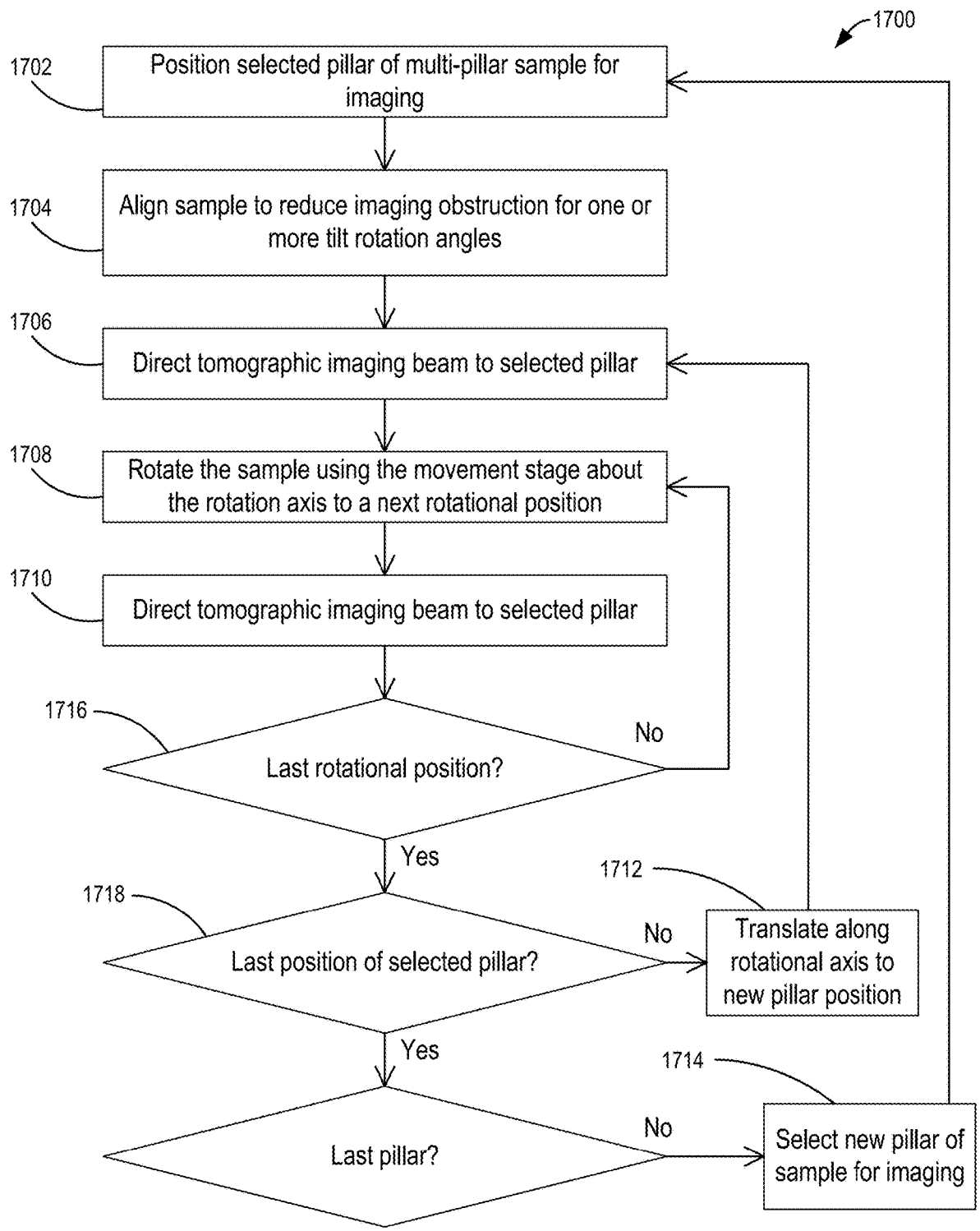
FIG. 17 is a flowchart of a method of tomographic imaging of a multi-pillar sample.

FIG. 17 is a method 1700 of tomographically imaging a multi-pillar sample with a transmission electron microscope (TEM). The method 1700 can include holding a multi-pillar sample at a position with a selected pillar in view for imaging at 1702. The sample is preferably at a eucentric position so that rotation of the sample does not require substantial adjustments to the sample after rotation. Eucentric positions can generally correspond to a position (such as a point, line, or height) where a tilt rotation of the sample, e.g., through rotation by a movement stage, does not cause substantial displacement of the sample in the field of view of the microscope that would otherwise require repositioning or realignment. At 1704, the positioning of the sample can be confirmed or otherwise aligned so that pillars of the multi-pillar sample are arranged at a slight tilt angle from a 0 degree imaging position, thereby providing an obstruction avoidance after subsequent rotation of the sample to tilt extrema such as +90 degrees or −90 degrees. By way of example, the slight tilt angle may be achieved by preparing the pillars offsets from each other along vertical direction of the substrate (shown in FIG. 10), or rotating the movement stage for the slight tilt angle. At 1706, an imaging beam is directed to the selected pillar to produce a tomographic image. At 1708, the sample is rotated about an axis of the selected pillar by a selected rotational increment (or a continuous rotational movement), and at 1710 a subsequent image of the sample is formed with the imaging beam at a subsequent rotational position. At 1716, method 1700 checks whether all rotational positions have been imaged. If the answer is NO, the sample is rotated at 1708 and another tomographic image is acquired. If all rotational positions have been imaged, another position along the pillar axis of the selected pillar may optionally be imaged. At 1718, if another position of the selected pillar is going to be imaged, the sample can be translated at 1712 along the rotational axis of the selected pillar being imaged and an additional series of tomographic images of another cross-section of the selected pillar can be collected. In one example, the sample is translated along the pillar axis by operating the movement stage. In another example, the imaging beam may be deflected along the pillar axis to image another pillar position. After a selected pillar is imaged, additional pillars can be imaged at 1714 by translating the sample with the movement stage in x, y, and/or z directions so that an adjacent or other selected pillar of the multi-pillar sample can be rotatably imaged. In some examples, the imaging of rotational positions can also include imaging in various sequences, e.g., by imaging a rotational position of a selected pillar, translating to a new pillar position or selecting a new pillar and imaging the new position or pillar, and returning to a different rotational increment of the initial selected pillar.

After images of multi-pillar samples are acquired, various tomographic reconstruction techniques can be used to form 3D reconstructed images, e.g., covering the full angular span (360 degrees) of each imaged pillar from the acquired images. Due to the pillar shape, a fuller range of images can be acquired as compared with lamella samples. Due to the arrangement of the pillars, the acquired tomographic images for a particular pillar can include no or minimal obstruction from other pillars. Therefore, one or more missing wedges associated with obstruction by other pillars can be absent from the reconstructed 3D image. The reconstruction techniques include iterative approaches, search, expectation maximization, weighted back-projection, etc. Images can be stored locally memory and reconstruction techniques can be applied by a local processor, or images can be communicated to a separate device with a separate memory and/or processor.

In some examples, one or more pillars of the multi-pillar sample may be imaged in a helical trajectory with combined beam deflection and movement stage rotation, as disclosed in application "HELICAL TRAJECTORY VIA COMBINATION OF IMAGE SHIFT AND HARDWARE ALPHA TILT" filed Mar. 23, 2021, the contents of which are incorporated by reference herein. Many of the disclosed steps can be automated by a controller, e.g., imaging a pillar, rotating to subsequent angular positions, reimaging, translating to a new pillar and imaging the new pillar, etc.

The following Table 1 illustrates various sample processing time enhancements that can be obtained by using multi-pillar examples. In general, throughput increases of 1.5×, 2×, 5×, 10×, 20×, or more, can be obtained by using multi-pillar samples instead of single pillars.

TABLE 1

Performance Improvements for Selected Multi-pillar Samples

| | Time (hours) needed per pillar for imaging 10 pillars | |
| --- | --- | --- |
| | 10 pillars/carrier (Multi-pillar) | 1 pillar/carrier (Single Pillar) |
| HPF freezing | 0.1 | 1 |
| FIB/SEM | 0.55 | 1 |
| Sample Handling | 0.01 | 0.1 |
| TEM imaging | 1.82 | 4.4 |
| Total | 2.48 | 6.5 |

By preparing and imaging multiple pillars together, less time is required for sample freezing, sample transfer between tools, and preparing tools (such as pumping down) for tomographic image acquisition. Thus, as shown, switching to ten pillars per carrier can produce a 2.62× improvement in processing time.

Figure 18:
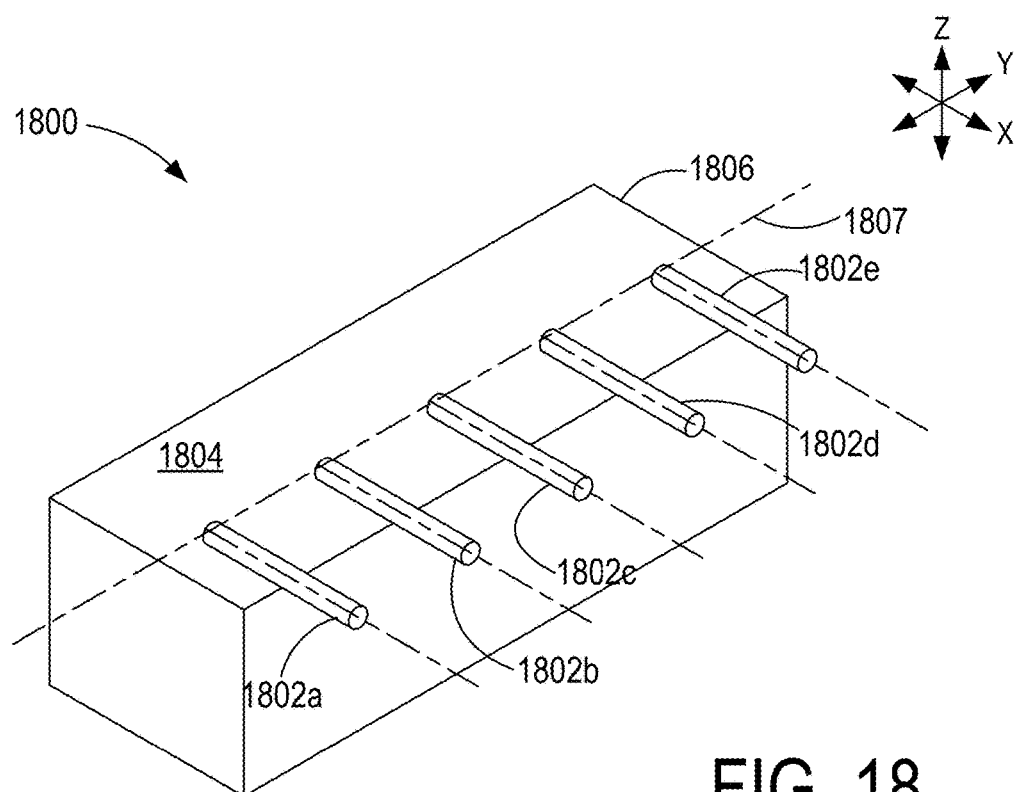
FIGS. 18-19 are perspective views of additional multi-pillar samples.

FIG. 18 is a multi-pillar sample 1800 including a plurality of pillars 1802a-1802e secured to a surface 1804 of a carrier 1806, e.g., through lift-out and welding processes. In some examples, the carrier 1806 can instead be a separate substrate mountable to a carrier. The pillars 1802a-1802e can be arranged parallel to each other to facilitate tomographic imaging of each pillar. In some examples, the pillars 1802a-1802e are arranged in a line 1807 parallel to the surface 1804. In selected examples, the surface 1806 can be raised at an angle relative to another reference surface of the carrier 1806, such as a bottom surface 1808, a reference surface of a separate carrier to which the carrier 1806 is attached, etc., such that the line forms a small angle. In further examples, the pillars 1802a-1802e can be arranged on separate surfaces, such as with a stair-step arrangement, providing the line 1807 at the small angle.

Figure 19:
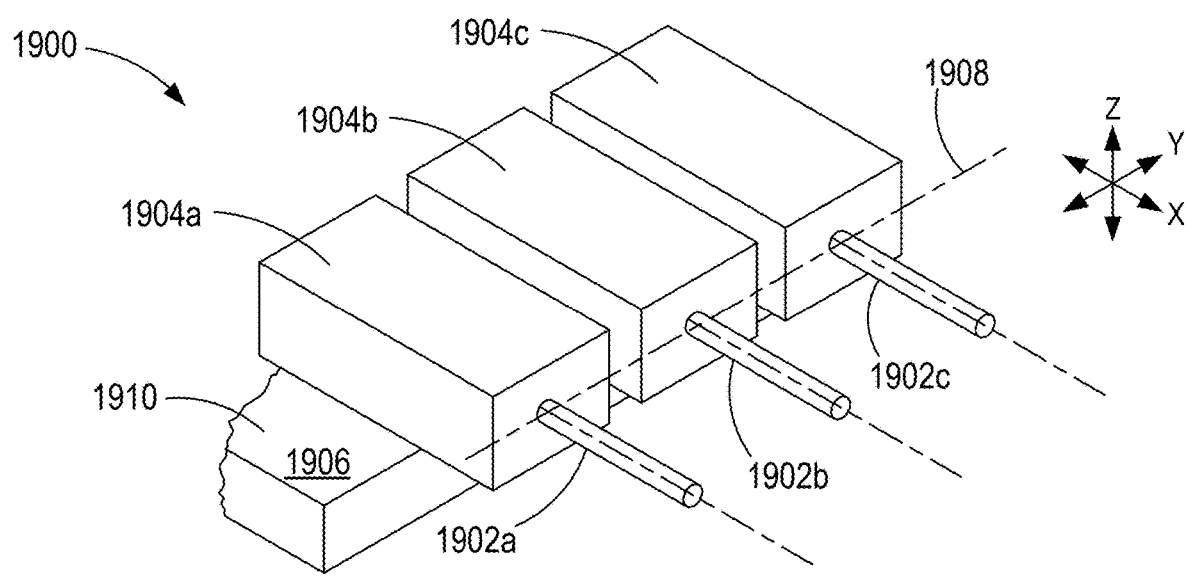

FIG. 19 is a multi-pillar sample 1900 include a plurality of pillars 1902a-1902c extending from respective substrates 1904a-1904c. The substrates 1904a-1904c are attached to a carrier 1906. The carrier 1906 can also be a substrate that is attached to a separate carrier in some examples. The pillars 1902a-1902c can be arranged to form a line 1908 that is parallel or at a small angle relative to a reference surface 1910 of the carrier 1906. The small angle can be formed in various ways, such as a height difference between the different substrates 1904a-1904c, relative placement on the different substrates 1904a-1904c, stepped or angle of the reference surface 1910, etc.

FIG. 20 is another method 2000 of forming a multi-pillar sample. At 2002, a plurality of pillars are formed, e.g., with focused ion beam milling, from one or more substrates or sample materials. At 2004, the pillars are attached to a substrate (which can correspond to a sample carrier in some examples) to form a multi-pillar sample, e.g., by using a micro-manipulator tool and an attachment technique such as micro-welding.

FIG. 21 is a further method 2100 of forming a multi-pillar sample. At 2102, one or more substrates are formed with one or more pillars attached to each substrate. At 2104, the substrates having the attached pillars are then arranged adjacent to each other on a substrate or sample carrier to form a multi-pillar sample.

Additional Examples

Multi-pillar tomographic samples can include a bulk substrate and a plurality of tomographic pillars extending from the substrate and arranged at different positions along the substrate in a spaced series. Methods can include imaging a first tomographic pillar of a multi-pillar sample with an imaging beam, moving the multi-pillar sample with the movement stage such that a second pillar of the multi-pillar sample is in view of the imaging beam, and imaging the second tomographic pillar with the imaging beam. Methods can further include milling a bulk substrate to form multiple pillars. Apparatus include an imaging system configured to direct an imaging beam to a multi-pillar sample, and a movement stage configured to move and rotate the multi-pillar sample about a plurality of different pillar axes of the multi-pillar sample.

Further examples include those described in the following numbered paragraphs:

1. A multi-pillar tomographic sample, comprising: a bulk substrate; and a plurality of tomographic pillars extending from the substrate and arranged at different positions along the substrate in a spaced series.

2. The multi-pillar sample of any of the preceding paragraphs, wherein the spaced series forms a line, wherein the line and spacing of the spaced series is configured to reduce an obstruction in tilt-rotation imaging each pillar.

3. The multi-pillar sample of any of the preceding paragraphs, wherein the bulk substrate extends in a sample plane and a plurality of the pillars extend parallel to each other and the sample plane in a pillar plane parallel to the sample plane.

4. The multi-pillar sample of any of the preceding paragraphs, wherein the bulk substrate extends in a sample plane and the pillars extend parallel to each other and the sample plane in a pillar plane having a tilted relationship to the sample plane.

5. The multi-pillar sample of paragraph 4, wherein transmission cross-sections of adjacent pillars are arranged in a non-overlapping spaced relationship in a direction perpendicular to the sample plane.

6. The multi-pillar sample of any of paragraphs 2-5, wherein the spaced series forms a plurality of lines spaced apart forming a 2-d grid arrangement of pillars.

7. The multi-pillar sample of any of the preceding paragraphs, wherein the pillars comprise cryogenic electron tomography pillars.

8. The multi-pillar sample of any of the preceding paragraphs, wherein the pillars have a tip thickness of less than about 400 nm, a base thickness of more than about 400 nm, and a length of greater than about 1 µm.

9. A sample carrier, comprising: a carrier base; and a multi-pillar sample of any of the preceding paragraphs supported by the carrier base.

10. A method, comprising: focused-ion beam milling a raw bulk substrate to form the multi-pillar sample of any of the preceding paragraphs.

11. A method, comprising: imaging a first tomographic pillar of a multi-pillar sample with an imaging beam; moving the multi-pillar sample with the movement stage such that a second pillar of the multi-pillar sample is in view of the imaging beam; and imaging the second tomographic pillar with the imaging beam.

12. The method of paragraph 11, wherein the imaging the first tomographic pillar includes imaging at a plurality of rotational positions by rotating the multi-pillar sample about a movement stage rotation axis aligned with a first pillar axis of the first pillar; wherein the moving the multi-pillar sample includes moving the multi-pillar sample such that a movement stage rotation axis is aligned with a second pillar axis of the second pillar; wherein the imaging the second tomographic pillar includes imaging the second pillar at a plurality of rotational positions by rotating the multi-pillar sample about the movement stage rotation axis aligned with the second pillar axis.

13. The method of any of paragraphs 11-12, further comprising translating the multi-pillar sample along the first pillar axis and rotatably imaging another section of the first pillar before moving the multi-pillar sample to image the second pillar.

14. The method of any of paragraphs 11-13, wherein the imaging the first tomographic pillar includes rotating the multi-pillar sample to a +90 degree position or a −90 degree position and producing an obstruction free image at the selected position based on an angled linear arrangement of a plurality of pillars of the multi-pillar sample.

15. The method of any of paragraphs 12-15, wherein the multi-pillar sample comprises the sample of any of paragraphs 1-10.

16. The method of paragraph 15, wherein the spaced series of the multi-pillar sample forms a line, wherein the line and spacing of the spaced series is configured to reduce an obstruction in tilt-rotation imaging each pillar.

17. An apparatus, comprising: an imaging system configured to direct an imaging beam to a multi-pillar sample; and a movement stage configured to move and rotate the multi-pillar sample about a plurality of different pillar axes of the multi-pillar sample.

18. The apparatus of paragraph 17, further comprising: a processor and memory coupled to the sample stage and imaging system wherein the memory includes code that, when executed by the processor: causes the sample stage to rotate the multi-pillar sample about a rotation axis aligned with a first pillar axis of a first pillar, to move the multi-pillar sample such that the sample stage rotation axis is aligned with a second pillar axis of a second pillar, and to rotate the multi-pillar sample about the second pillar axis, and causes the imaging system to direct the imaging beam through the first pillar at a plurality of rotational positions about the rotation axis aligned with the first pillar axis, and to direct the imaging beam through the second pillar at a plurality of rotational positions about the rotation axis aligned with the second pillar axis.

19. The apparatus of any of paragraphs 17-18, further comprising a focused ion beam system configured to direct a focused ion beam to mill a raw sample substrate to form the multi-pillar sample.

20. The apparatus of any of paragraphs 17-19, wherein the imaging system and movement stage comprise a transmission electron microscope.

General Considerations

As used herein, image, projection, and image projection can refer to a distribution of electrons or other imaging beam energy directed to and/or received and detected by an imaging sensor after transmission of an imaging beam through a sample, presentation of image data on a display, or data associated with a visual image such as stored in a JPG, TIFF, or other data file. Disclosed examples are described in relation to electron beams as penetrating energy used in 3D tomographic imaging, but it will be appreciated that other charged particle beam or energy beam sources can be used in some examples, including x-ray and ultrasound. While microscope examples are generally described with a selection of components for convenience of illustration and description of operating principles, it will be appreciated that other components can be included or components removed as well.

The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation. Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. In particular, many of the described image collection and stage rotations and/or beam deflections need not be performed in a specific sequential order. Some sequences are generally preferred, such as a series of rotational increments or a series of images formed through beam deflection at a selected rotational increment. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level descriptions of the actual operations that are performed. The actual operations that correspond to these terms will vary depending on the particular implementation and are readily discernible by one of ordinary skill in the art.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope of the appended claims.

We claim:

1. A method, comprising:
providing a multi-pillar sample including at least a first pillar and a second pillar parallel with the first pillar;
directing a charged particle beam to the first pillar;
imaging the first pillar at a plurality of rotational positions by rotating the multi-pillar sample about a first pillar axis of the first pillar;
directing the charged particle beam to the second pillar; and
imaging the second pillar at a plurality of rotational positions by rotating the multi-pillar sample about a second pillar axis of the second pillar.

2. The method of claim 1, further comprising reconstructing 3D images of the first pillar and the second pillar.

3. The method of claim 2, wherein the 3D images covering a full angular span of the first and the second pillar.

4. The method of claim 1, wherein a range of the plurality of positions is at least 170 degrees.

5. The method of claim 1, wherein a range of the plurality of positions is at least 80 degrees.

6. The method of claim 1, wherein a range of the plurality of positions is at least 180 degrees.

7. The method of claim 1, further comprising translating the multi-pillar sample along the first pillar axis and rotatably imaging another section of the first pillar before moving the multi-pillar sample to image the second pillar.

8. The method of claim 1, wherein imaging the first pillar includes rotating the multi-pillar sample to a selected position of either a +90 degree position or a −90 degree position and producing an image at the selected position with reduced obstruction by the second pillar or other pillars of the multi-pillar sample based on an angled linear arrangement of a plurality of pillars of the multi-pillar sample relative to a 0 degree position.

9. The method of claim 1, wherein the multi-pillar sample comprises a substrate defined by a length, a width, and a height, wherein the first pillar and the second pillar extend from the substrate along the height of the substrate and are arranged at different positions on the length of the substrate in a spaced series.

10. The method of claim 9, wherein the substrate is a sample carrier.

11. The method of claim 9, further comprising attaching a plurality of pillars to the substrate to form the multi-pillar sample.

12. The method of claim 1, wherein a distance between the first pillar and the second pillar is greater than 10 times of a diameter of either the first pillar or the second pillar.

13. The method of claim 1, further comprising directing a focused ion beam to mill a raw sample substrate to form the multi-pillar sample.

14. An apparatus, comprising:
an imaging system configured to direct a charged particle beam to a multi-pillar sample including at least a first pillar and a second pillar;
a movement stage configured to move and rotate the multi-pillar sample about a plurality of different pillar axes of the multi-pillar sample; and
a processor and memory coupled to the sample stage and the imaging system wherein the memory includes code that, when executed by the processor:
causes the sample stage to rotate the multi-pillar sample about a first pillar axis of a first pillar, and to rotate the multi-pillar sample about a second pillar axis of the second pillar, and
causes the imaging system to direct the imaging beam through the first pillar at a plurality of rotational positions about the first pillar axis, and to direct the imaging beam through the second pillar at a plurality of rotational positions about the second pillar axis.

15. The apparatus of claim 14, further comprising an imaging sensor for detecting charged particles transmitted through the first pillar and the second pillar, and the memory includes further code that, when executed by the processor: causes the imaging sensor to detect a plurality of first images of the first pillar at the plurality of rotational positions about the first pillar axis, and detect a plurality of second images of the second pillar at the plurality of rotational positions about the second pillar axis.

16. The apparatus of claim 14, wherein the memory includes further code that, when executed by the processor: causes the processor to reconstruct 3D images of the first pillar and the second pillar based on the plurality of first images and the plurality of second images, respectively.

17. The apparatus of claim 14, wherein the multi-pillar sample comprises:
a substrate defined by a length, a width, and a height, the substrate extending in a plane defined by the length and width; and
the first pillar and the second pillar extending parallel to each other from the substrate along the height of the substrate and arranged at different positions on the length of the substrate in a spaced series.

18. The apparatus of claim 17, further comprising a sample carrier, and the substrate is the sample carrier.

19. The apparatus of claim 17, wherein the first pillar axis and the second pillar axis form a pillar plane not parallel with a plane defined by the length and width of the substrate.

20. The apparatus of claim 14, wherein the memory includes further code that, when executed by the processor: causes the sample stage to move the multi-pillar sample so that the charged particle beam is directed to the first pillar or the second pillar.

21. The apparatus of claim 14, wherein the first pillar and the second pillar have a tip thickness of less than 400 nm, a base thickness of more than 400 nm, and a length of greater than 1 μm.

22. The apparatus of claim 14, wherein the first pillar and the second pillar have a tip thickness of less than 600 nm, a base thickness of more than 400 nm, and a length of greater than 1 μm.

* * * * *